United States Patent
Azmat et al.

(10) Patent No.: US 11,223,344 B2
(45) Date of Patent: Jan. 11, 2022

(54) SCAN FLIP-FLOP, FLIP-FLOP AND SCAN TEST CIRCUIT INCLUDING THE SAME

(71) Applicant: Samsung Electronics Co., Ltd., Suwon-si (KR)

(72) Inventors: Raheel Azmat, Suwon-si (KR); Jaehyoung Lim, Anyang-si (KR); Taehyung Kim, Hwaseong-si (KR); Jinwoo Jeong, Suwon-si (KR); Jaeseok Yang, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/993,946

(22) Filed: Aug. 14, 2020

(65) Prior Publication Data
US 2021/0152162 A1    May 20, 2021

(30) Foreign Application Priority Data
Nov. 18, 2019  (KR) .................. 10-2019-0147561

(51) Int. Cl.
*H03K 3/037*      (2006.01)
*G01R 31/317*     (2006.01)
*G01R 31/3177*    (2006.01)

(52) U.S. Cl.
CPC ....... *H03K 3/0372* (2013.01); *G01R 31/3177* (2013.01); *G01R 31/31704* (2013.01); *G01R 31/31723* (2013.01)

(58) Field of Classification Search
CPC ............ G01R 31/00; G01R 31/31704; G01R 31/31723; G01R 31/3177; H03K 3/00; H03K 3/012; H03K 3/0372; H03K 3/0375; H03K 3/356156; H03K 3/35625
USPC ........................................................ 327/203
See application file for complete search history.

(56) References Cited

U.S. PATENT DOCUMENTS

| | | | |
|---|---|---|---|
| 8,274,319 B2 | 9/2012 | Maeno | |
| 8,513,999 B2 | 8/2013 | Uemura | |
| 8,957,718 B2 | 2/2015 | Maeno | |
| 9,310,435 B2 | 4/2016 | Chen et al. | |
| 9,324,715 B2 | 4/2016 | Azmat et al. | |
| 9,641,161 B1 * | 5/2017 | Liu | ........ H01L 27/092 |
| 9,753,086 B2 | 9/2017 | Kim et al. | |
| 2011/0156786 A1 | 6/2011 | Yamaguchi | |
| 2016/0097811 A1 * | 4/2016 | Kim | ........ H03K 3/35625 714/726 |
| 2019/0319022 A1 * | 10/2019 | Song | ........ H01L 27/0924 |

\* cited by examiner

*Primary Examiner* — Lincoln D Donovan
*Assistant Examiner* — Dave Mattison
(74) *Attorney, Agent, or Firm* — Myers Bigel, P.A.

(57) ABSTRACT

A scan flip-flop includes a multiplexer, a first latch, a second latch, an output buffer and a clock buffer. The multiplexer selects one of a data input signal and a scan input signal based on an operation mode. The first latch latches an output of the multiplexer. The second latch latches an output of the first latch. The output buffer generates an output signal based on an output of the second latch. The clock buffer generates a first clock signal and a second clock signal that control operation of the first latch and the second latch. The first latch, the second latch, and the clock buffer are sequentially arranged along a first direction. A first clock line supplying the first clock signal and a second clock line supplying the second clock signal have a cross couple connection.

20 Claims, 13 Drawing Sheets

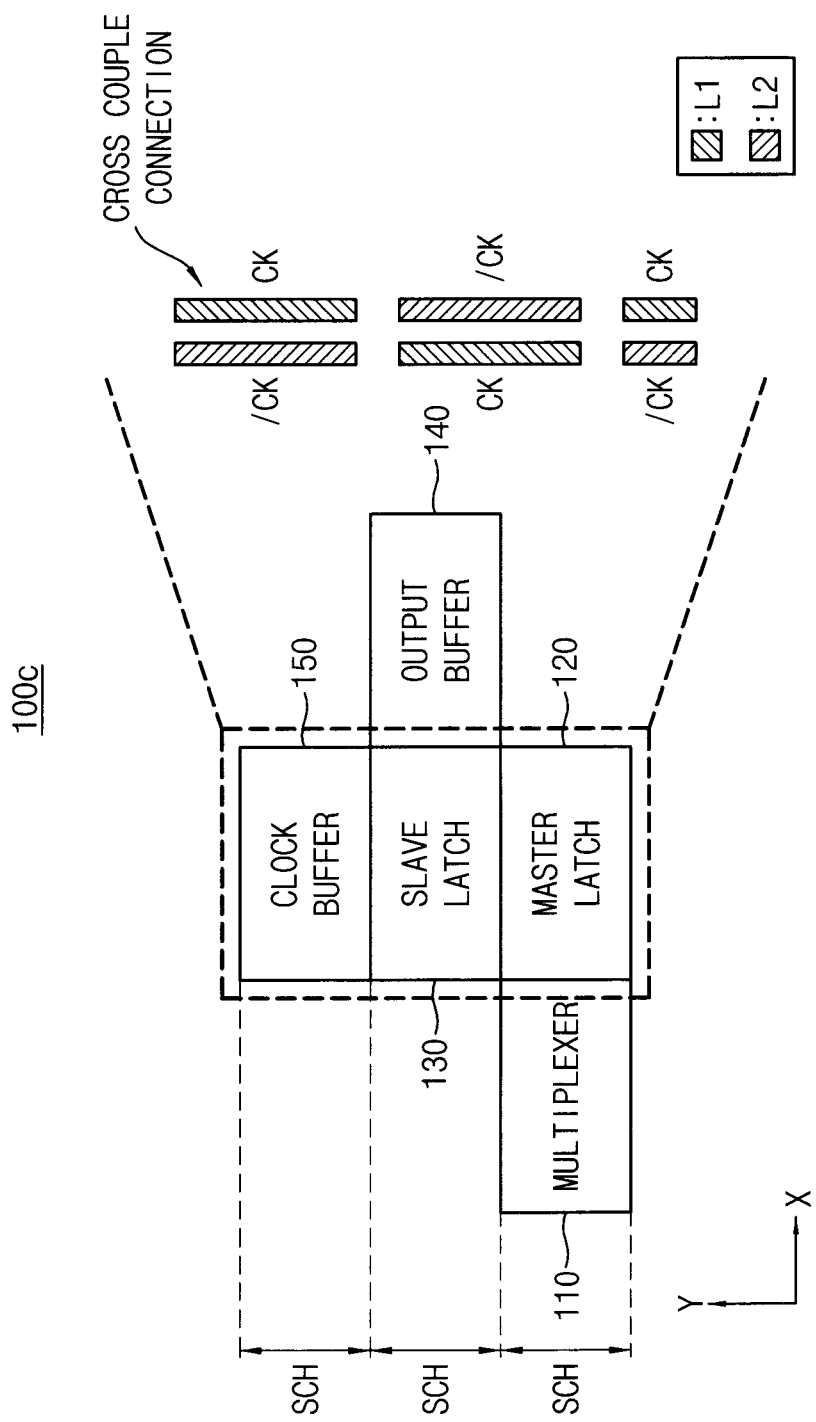

SCAN FLIP-FLOP, FLIP-FLOP AND SCAN TEST CIRCUIT INCLUDING THE SAME

CROSS-REFERENCE TO RELATED APPLICATION

This application claims priority under 35 USC § 119 to Korean Patent Application No. 10-2019-0147561, filed on Nov. 18, 2019 in the Korean Intellectual Property Office (KIPO), the contents of which are herein incorporated by reference in their entirety.

FIELD

Example embodiments relate generally to semiconductor integrated circuits, and more particularly to scan flip-flops, flip-flops and scan test circuits including the scan flip-flops.

BACKGROUND

Semiconductor devices may be increasingly being used in consumer, commercial and other electronic devices. Semiconductor devices may be classified as memory devices for storing data, logic devices for processing data, and hybrid devices including both memory and logic elements. Due to increased demand for electronic devices with high speed and/or low power consumption, these semiconductor devices can be used to provide high reliability, high performance, and/or multiple functions. To satisfy these technical requirements, complexity and/or integration density of semiconductor devices may be increased.

As semiconductor chips become increasingly integrated, significant time and resources may be expended in testing the semiconductor chips. Design for testability (DFT) technology may be adopted to assure semiconductor chip quality standards and enhance test efficiency. Scan testing may be an aspect of DFT technology.

SUMMARY

At least one example embodiment of the present disclosure provides a scan flip-flop and a flip-flop capable of improving or enhancing degree of integration and space efficiency.

At least one example embodiment of the present disclosure provides a scan test circuit including the scan flip-flop.

According to example embodiments, a scan flip-flop includes a multiplexer, a first latch, a second latch, an output buffer, and a clock buffer. The multiplexer is configured to select a data input signal or a scan input signal based on an operation mode. The first latch is configured to latch an output of the multiplexer. The second latch is configured to latch an output of the first latch. The output buffer is configured to generate an output signal based on an output of the second latch. The clock buffer is configured to generate a first clock signal and a second clock signal that control operation of the first latch and the second latch. The first latch, the second latch, and the clock buffer are sequentially arranged along a first direction. Each of the multiplexer and the output buffer is adjacent the first latch, the second latch, or the clock buffer along a second direction intersecting the first direction. A first clock line configured to supply the first clock signal and a second clock line configured to supply the second clock signal have a cross couple connection.

According to example embodiments, a scan test circuit includes a sequential circuit unit and a combinational circuit unit. The sequential circuit unit includes a first scan flip-flop and a second scan flip-flop. The combinational circuit unit includes a first combinational logic circuit and a second combinational logic circuit. The first combinational logic circuit is configured to perform a logical operation on a plurality of data to generate a first data input signal, and is configured to provide the first data input signal to the first scan flip-flop. The second combinational logic circuit is configured to perform a logical operation on an output signal of the first scan flip flop to generate a second data input signal, and is configured to provide the second data input signal to the second scan flip-flop. The first scan flip-flop includes a multiplexer, a first latch, a second latch, an output buffer, and a clock buffer. The first latch, the second latch, and the clock buffer are sequentially arranged along a first direction. Each of the multiplexer and the output buffer is adjacent one of the first latch, the second latch, or the clock buffer along a second direction intersecting the first direction. The clock buffer is configured to generate a first clock signal and a second clock signal that control operation of the first latch and the second latch. A first clock line configured to supply the first clock signal and a second clock line configured to supply the second clock signal have a cross couple connection.

According to example embodiments, a flip-flop includes a first latch, a second latch, an output buffer, and a clock buffer. The first latch is configured to latch an input signal. The second latch is configured to latch an output of the first latch. The output buffer is configured to generate an output signal based on an output of the second latch. The clock buffer is configured to generate a first clock signal and a second clock signal that control operation of the first latch and the second latch. The first latch, the second latch, and the clock buffer are sequentially arranged along a first direction. The output buffer is adjacent the first latch, the second latch, or the clock buffer along a second direction intersecting the first direction. A first clock line configured to supply the first clock signal and a second clock line configured to supply the second clock signal have a cross couple connection. A first region including first latch includes a first metal oxide semiconductor field effect transistor (MOSFET) region and a second MOSFET region spaced apart from each other in the first direction, a first gate electrode and a second gate electrode extending along the first direction on the first MOSFET region, a third gate electrode and a fourth gate electrode extending along the first direction on the second MOSFET region, and a first connection structure. The third gate electrode is aligned with the first gate electrode along the first direction, and the fourth gate electrode is aligned with the second gate electrode along the first direction. The first connection structure electrically connects the first gate electrode with the fourth gate electrode, and electrically connects the second gate electrode with the third gate electrode. The first gate electrode and the second gate electrode cross a first power rail between the first region and a second region including the second latch, and extend to a third MOSFET region in the second region. The second region includes the third MOSFET region and a fourth MOSFET region spaced apart from each other in the first direction, a fifth gate electrode and a sixth gate electrode extending along the first direction on the fourth MOSFET region, and a second connection structure. The fifth gate electrode is aligned with the first gate electrode along the first direction, and the sixth gate electrode is aligned with the second gate electrode along the first direction. The second connection structure electrically connects the first gate electrode with the sixth gate electrode, and electrically connects the second gate electrode with the fifth gate electrode. The fifth gate electrode and the sixth gate electrode cross a second power rail between the second region and a third region including the clock buffer, and extend to a fifth MOSFET region and a sixth MOSFET region that are included in the third region and are spaced apart from each other in the first direction.

In the scan flip-flop, the flip-flop, and the scan test circuit according to example embodiments, the multiplexer, the first latch, the second latch, the output buffer, and the clock buffer may be arranged in two dimensions in a plan view. The first latch, the second latch, and the clock buffer may be implemented with a parallel structure in which the first latch, the second latch, and the clock buffer are sequentially arranged along the vertical direction, and thus the scan flip-flop and/or the flip-flop may have a triple height implementation. In addition, the first clock line and the second clock line that supply the first clock signal and the second clock signal generated from the clock buffer to the first latch and the second latch may be formed to have a cross couple connection. Accordingly, congestion, resistance and capacitance of metal lines on a layout may be reduced, and congestion of a layout including the scan flip-flop and/or the flip-flop may be reduced.

BRIEF DESCRIPTION OF THE DRAWINGS

Illustrative, non-limiting example embodiments will be more clearly understood from the following detailed description taken in conjunction with the accompanying drawings.

FIG. 9 is a plan view of a scan flip-flop according to example embodiments.

DETAILED DESCRIPTION OF THE EMBODIMENTS

Figure 1:
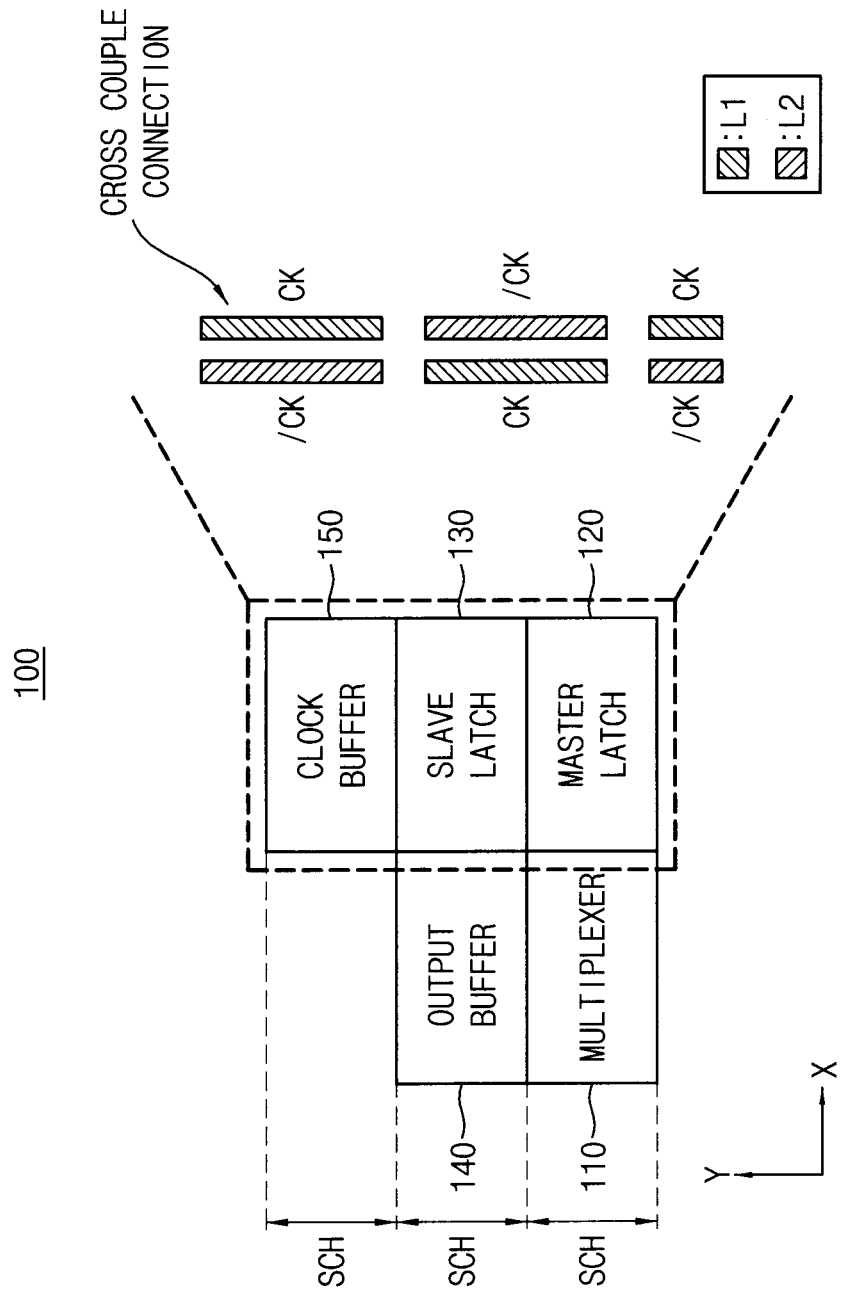
FIG. 1 is a plan view of a scan flip-flop according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a plan view of a scan flip-flop according to example embodiments.

Referring to FIG. 1, a scan flip-flop 100 includes a multiplexer 110, a first latch 120, a second latch 130, an output buffer 140 and a clock buffer 150. The terms "first," "second," etc. may be used herein to differentiate one element from another.

FIG. 1 illustrates a planar arrangement of components included in the scan flip-flop 100, and detailed configurations and operations of the components included in the scan flip-flop 100 will be described with reference to FIG. 2 and other figures.

The first latch 120, the second latch 130 and the clock buffer 150 are sequentially arranged along a first direction Y (e.g., a vertical direction). In other words, the first latch 120, the second latch 130 and the clock buffer 150 may be implemented with a parallel structure in which the first latch 120, the second latch 130 and the clock buffer 150 may be vertically aligned with each other. For example, in a plan view (or in a plane, e.g., the X-Y plane), the first latch 120 may be disposed at the bottom, the second latch 130 may be disposed on the first latch 120, and the clock buffer 150 may be disposed on the second latch 130. However, example embodiments are not limited thereto, and an arrangement order of the first latch 120, the second latch 130 and the clock buffer 150 may be changed according to example embodiments.

In some example embodiments, the first latch 120 may be a master latch, and the second latch 130 may be a slave latch.

Each of the multiplexer 110 and the output buffer 140 is disposed adjacent to one of the first latch 120, the second latch 130 and the clock buffer 150 along a second direction X (e.g., a horizontal direction). As used herein, "one of elements A and B" may refer to "element A or element B." The second direction X is a direction crossing or intersecting with (e.g., substantially perpendicular to) the first direction Y. For example, in a plan view, the multiplexer 110 may be disposed adjacent to the first latch 120 along the second direction X, and the output buffer 140 may be disposed adjacent to the second latch 130 along the second direction X. However, example embodiments are not limited thereto, and positions of the multiplexer 110 and the output buffer 140 may be changed according to example embodiments.

In the example of FIG. 1, both the multiplexer 110 and the output buffer 140 may be disposed adjacent to the same side (e.g., the multiplexer 110 and the output buffer 140 may be on a first side) of the first latch 120, the second latch 130 and the clock buffer 150. However, example embodiments are not limited thereto, and the multiplexer 110 and the output buffer 140 may be disposed adjacent to different sides (e.g., the multiplexer 110 and the output buffer 140 may be on opposite sides) of the first latch 120, the second latch 130 and the clock buffer 150. For example, as illustrated in FIG. 9, one of the multiplexer 110 and the output buffer 140 may be disposed adjacent to the first side of the first latch 120, the second latch 130 and the clock buffer 150, and the other one of the multiplexer 110 and the output buffer 140 may be disposed adjacent to a second side of the first latch 120, the second latch 130 and the clock buffer 150. The second side may be opposite to the first side.

In some example embodiments, each of the components, which are the multiplexer 110, the first latch 120, the second latch 130, the output buffer 140 and the clock buffer 150, included in the scan flip-flop 100 may have the same height (e.g., a standard height SCH) in the first direction Y. For example, the height SCH may be equal to the minimum height of a standard cell (e.g., a height of a single height cell). Thus, the components included in the scan flip-flop 100 may be aligned to a plurality of rows. Although FIG. 1 illustrates that the components have the same width in the second direction X, example embodiments are not limited thereto, and the components may have different widths in the second direction X.

As will be described with reference to FIG. 2, the clock buffer 150 generates a first clock signal CK and a second clock signal/CK, and provides to the first clock signal CK and the second clock signal/CK to the first latch 120 and the second latch 130. A first clock line (or wire or wiring) L1 supplying the first clock signal CK and a second clock line L2 supplying the second clock signal/CK are formed to have a cross couple connection.

For example, in the example of FIG. 1, the lower right conductive line, the middle left conductive line and the upper right conductive line, which are conductive lines of a first type, may be electrically connected to each other to form the first clock line L1, and may supply the first clock signal CK. Similarly, the lower left conductive line, the middle right conductive line and the upper left conductive line, which are conductive lines of a second type, may be electrically connected to each other to form the second clock line L2, and may supply the second clock signal/CK. As illustrated in FIG. 1, the conductive lines may be implemented with a cross arrangement or structure in which conductive lines in the same column are aligned with each other along the first direction Y and conductive lines of the same type are alternately arranged at each stage. Thus, at least one connection structure may be required to electrically connect conductive lines of the same type with each other (e.g., to implement the cross couple connection). The connection structure will be described with reference to FIGS. 4 and 5 and other figures.

In some example embodiments, the second clock signal/CK may be an inverted clock signal, e.g., in which the first clock signal CK is inverted.

In the scan flip-flop 100 according to example embodiments, the multiplexer 110, the first latch 120, the second latch 130, the output buffer 140 and the clock buffer 150 may be arranged in two dimensions in a plan view, the first latch 120, the second latch 130 and the clock buffer 150 may be implemented with the parallel structure in which the first latch 120, the second latch 130 and the clock buffer 150 are sequentially arranged along the first direction Y, and thus the scan flip-flop 100 may have a triple height implementation. In addition, the first clock line L1 and the second clock line L2 that supply the first clock signal CK and the second clock signal/CK generated from the clock buffer 150 to the first latch 120 and the second latch 130 may be formed to have the cross couple connection. Accordingly, congestion, resistance and capacitance of metal lines on a layout may be reduced, and congestion of a layout including the scan flip-flop 100 may be reduced.

Figure 2:
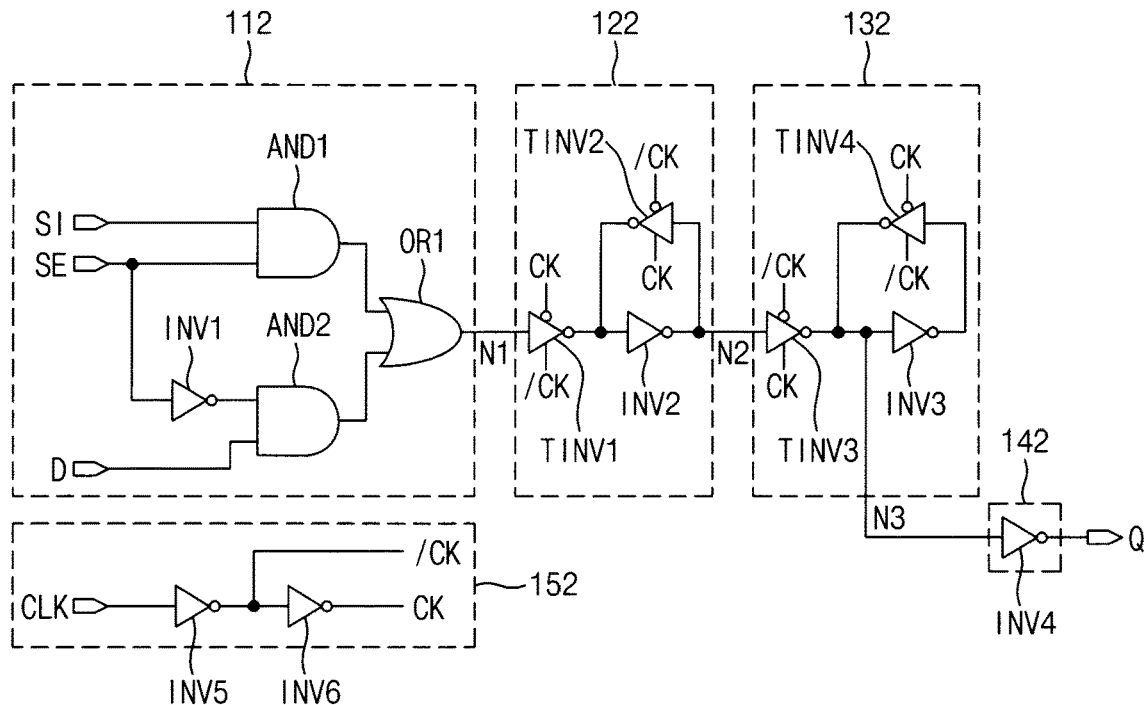
FIG. 2 is a block diagram illustrating an example of a scan flip-flop according to example embodiments.

FIG. 2 is a block diagram illustrating an example of a scan flip-flop according to example embodiments.

Referring to FIG. 2, a scan flip-flop 102 includes a multiplexer 112, a first latch 122, a second latch 132, an output buffer 142 and a clock buffer 152.

The multiplexer 112 select one of a data input signal received through a data input terminal D and a scan input signal received through a scan input terminal SI based on an operation mode to output a selected one of the data input signal and the scan input signal. For example, the multiplexer 112 may select and output the data input signal in a first operation mode, and may select and output the scan input signal in a second operation mode. For example, the first operation mode may be a normal operation mode for performing data transmission, and the second operation mode may be a scan test mode for performing a test operation.

In some example embodiments, the operation mode may be set or determined based on a logic level of a scan enable signal SE. For example, the operation mode may be the normal operation mode when the scan enable signal SE has a first logic level (e.g., a logic low level), and may be the scan test mode when the scan enable signal SE has a second logic level (e.g., a logic high level). However, example embodiments are not limited thereto.

The multiplexer 112 may include an inverter INV1, AND gates AND1 and AND2 and an OR gate OR1. The AND gate AND1 may include a first input terminal receiving the scan input signal SI, a second input terminal receiving the scan enable signal SE, and an output terminal. The inverter INV1 may invert the scan enable signal SE. The AND gate AND2 may include a first input terminal receiving an inverted scan enable signal, a second input terminal receiving the data input signal D, and an output terminal. The OR gate OR1 may include a first input terminal connected to an output of the AND gate AND1, a second input terminal connected to an output of the AND gate AND2, and an output terminal connected to a node N1.

The first latch 122 latches an output of the multiplexer 112, and the second latch 132 latches an output of the first latch 122. The first latch 122 may include an inverter INV2 and tri-state inverters TINV1 and TINV2, and the second latch 132 may include an inverter INV3 and tri-state inverters TINV3 and TINV4. The tri-state inverter TINV1 and the inverter INV2 may be connected in series between the node N1 and a node N2. The tri-state inverter TINV2 may include an input terminal connected to an output of the inverter INV2 and an output terminal connected to an input of the inverter INV2. Configurations of the inverter INV3 and the tri-state inverters TINV3 and TINV4 may be substantially the same as those of the inverter INV2 and the tri-state inverters TINV1 and TINV2.

The tri-state inverters TINV1, TINV2, TINV3 and TINV4 may operate based on the first clock signal CK and the second clock signal/CK. As described with reference to FIG. 1, the first clock line L1 and the second clock line L2 for supplying the first clock signal CK and the second clock signal/CK to the first latch 122 and the second latch 132 may be formed or implemented to have the cross couple connection.

The output buffer 142 generates an output signal output through an output terminal Q based on an output of the second latch 132. The output buffer 142 may include an inverter INV4. The inverter INV4 may invert a signal of a node N3 to generate the output signal.

The clock buffer 152 generates the first clock signal CK and the second clock signal/CK based on an input clock signal CLK. The clock buffer 152 may include inverters INV5 and INV6. The inverter INV5 may invert the input clock signal CLK to generate the second clock signal/CK. The inverter INV6 may invert an output of the inverter INV5 to generate the first clock signal CK.

Figure 3A:
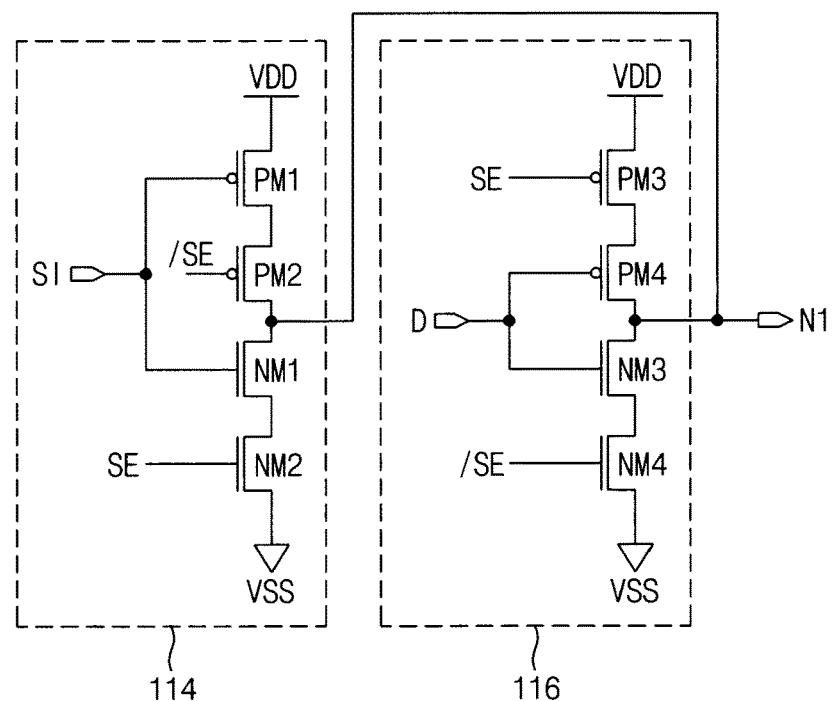
FIGS. 3A and 3B are circuit diagrams illustrating an example of a multiplexer and a first latch included in the scan flip-flop of FIG. 2
Figure 3B:
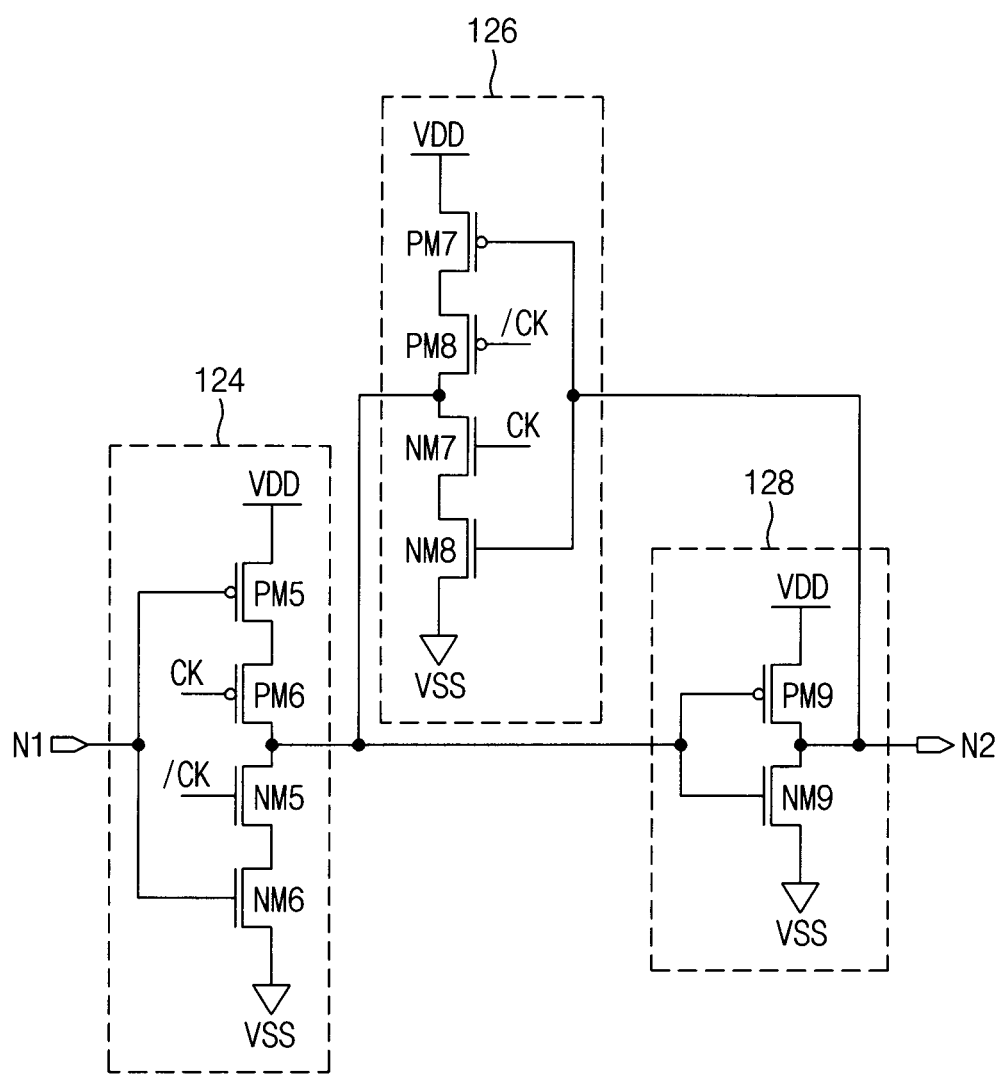

FIGS. 3A and 3B are circuit diagrams illustrating an example of a multiplexer and a first latch included in the scan flip-flop of FIG. 2

Referring to FIG. 3A, the multiplexer 112 may include a first circuit 114 to which the scan input signal is input and a second circuit 116 to which the data input signal is input. The first circuit 114 and the second circuit 116 may be connected in parallel to the node N1.

The first circuit 114 may include four transistors PM1, PM2, NM1 and NM2 connected in series. For example, among the transistors PM1, PM2, NM1 and NM2 that are sequentially connected between a power supply voltage VDD and a ground voltage VSS, the transistors PM1 and PM2 may be p-type metal oxide semiconductor (PMOS) transistors, and the transistors NM1 and NM2 may be n-type metal oxide semiconductor (NMOS) transistors. Gate electrodes of the transistors PM1 and NM1 may be connected to the scan input terminal SI, a gate electrode of the transistor PM2 may receive an inverted scan enable signal/SE, and a gate electrode of the transistor NM2 may receive the scan enable signal SE.

The second circuit 116 may include four transistors PM3, PM4, NM3 and NM4 connected in series. For example, among the transistors PM3, PM4, NM3 and NM4 that are sequentially connected between the power supply voltage VDD and the ground voltage VSS, the transistors PM3 and PM4 may be PMOS transistors, and the transistors NM3 and NM4 may be NMOS transistors. Gate electrodes of the transistors PM4 and NM3 may be connected to the data input terminal D, a gate electrode of the transistor PM3 may receive the scan enable signal SE, and a gate electrode of the transistor NM4 may receive the inverted scan enable signal/SE.

Referring to FIG. 3B, the first latch 122 may include a third circuit 124, a fourth circuit 126 and a fifth circuit 128 disposed between the node N1 and the node N2. The fourth circuit 126 and the fifth circuit 128 may be connected in parallel between the third circuit 124 and the node N2. The first clock signal CK and the second clock signal/CK may be input to each of the third circuit 124 and the fourth circuit 126.

The third circuit 124 may include four transistors PM5, PM6, NM5 and NM6 connected in series. For example, among the transistors PM5, PM6, NM5 and NM6 that are sequentially connected between the power supply voltage VDD and the ground voltage VSS, the transistors PM5 and PM6 may be PMOS transistors, and the transistors NM5 and NM6 may be NMOS transistors. Gate electrodes of the transistors PM5 and NM6 may receive a signal from the node N1, a gate electrode of the transistor PM6 may receive the first clock signal CK, and a gate electrode of the transistor NM5 may receive the second clock signal/CK.

The fourth circuit 126 may include four transistors PM7, PM8, NM7 and NM8 connected in series. For example, among the transistors PM7, PM8, NM7 and NM8 that are sequentially connected between the power supply voltage VDD and the ground voltage VSS, the transistors PM7 and PM8 may be PMOS transistors, and the transistors NM7 and NM8 may be NMOS transistors. Gate electrodes of the transistors PM7 and NM8 may be connected to the node N2, a gate electrode of the transistor PM8 may receive the second clock signal/CK, and a gate electrode of the transistor NM7 may receive the first clock signal CK.

The fifth circuit 128 may include two transistors PM9 and NM9 connected in series. For example, among the transistors PM9 and NM9 that are sequentially connected between the power supply voltage VDD and the ground voltage VSS, the transistor PM9 may be a PMOS transistor, and the transistor NM9 may be an NMOS transistor. Gate electrodes of the transistors PM9 and NM9 may be connected to outputs of the third circuit 124 and the fourth circuit 126.

Although not illustrated in FIGS. 3A and 3B, a configuration of the second latch 132 may be substantially the same as that of the first latch 122.

Figure 4:
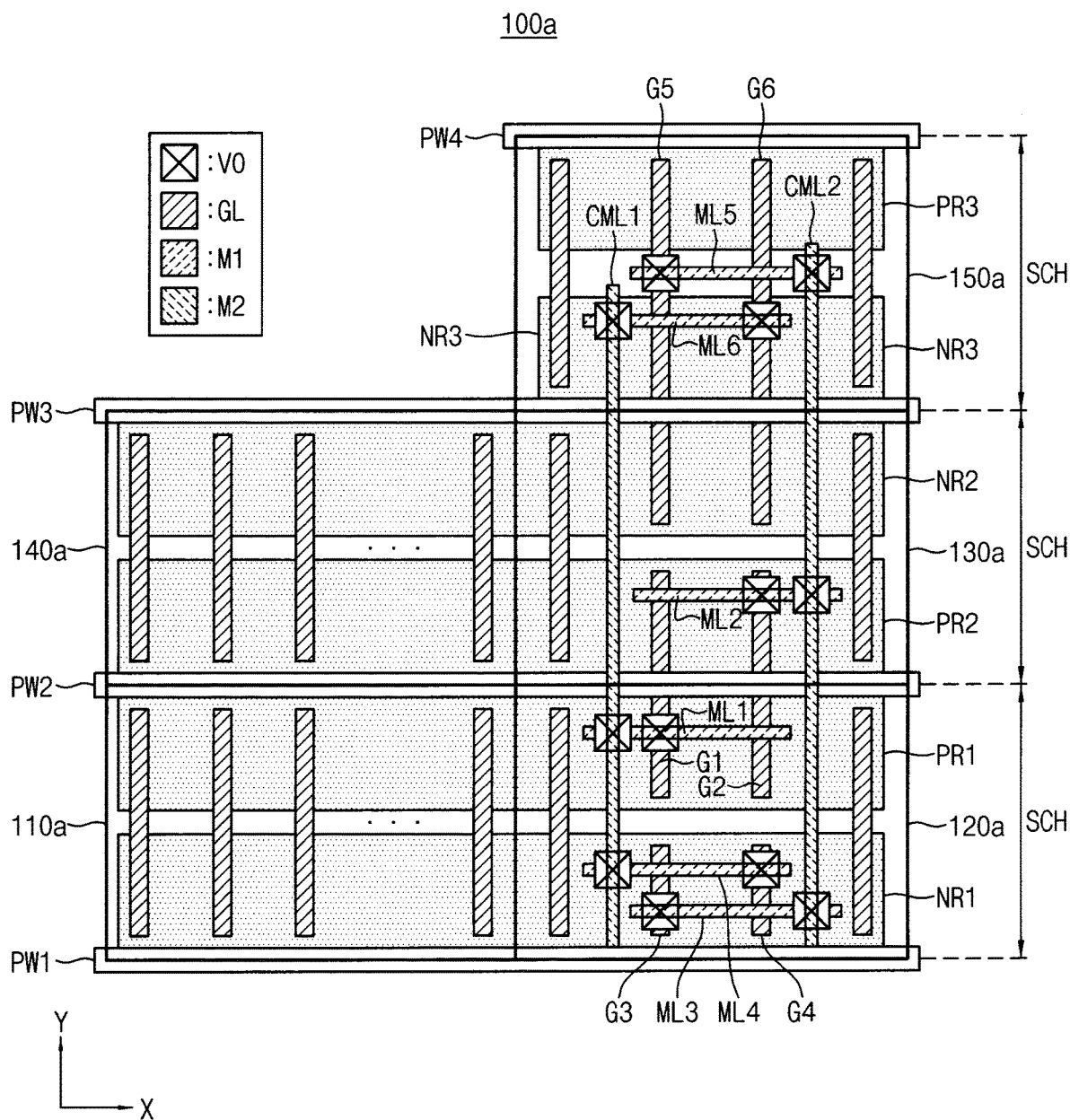
FIG. 4 is a plan view of an example of a layout of the scan flip-flop of FIG. 1.

FIG. 4 is a plan view of an example of a layout of the scan flip-flop of FIG. 1.

Referring to FIG. 4, a scan flip-flop 100a may include a first region 120a in which the first latch 120 is formed, a second region 130a in which the second latch 130 is formed, a third region 150a in which the clock buffer 150 is formed, a fourth region 110a in which the multiplexer 110 is formed, and a fifth region 140a in which the output buffer 140 is formed.

The arrangement, configuration and operation of components included in the scan flip-flop 100a of FIG. 4 may be substantially the same as described with reference to FIGS. 1 and 2. A configuration of the scan flip-flop 100a of FIG. 4 will be described with reference to the cross couple connection that is formed in or on the first region 120a, the second region 130a and the third region 150a to supply the first clock signal CK and the second clock signal/CK.

The first region 120a may be formed between a first power rail PW1 and a second power rail PW2. The first region 120a may include a first metal oxide semiconductor field effect transistor (MOSFET) region PR1, a second MOSFET region NR1, a first gate electrode G1, a second gate electrode G2, a third gate electrode G3, a fourth gate electrode G4 and a first connection structure.

The first MOSFET region PR1 and the second MOSFET region NR1 may be spaced apart from each other. The first and second MOSFET regions PR1 and NR1 may be formed in a substrate, and a first device isolation layer may be provided on the substrate to define the first and second MOSFET regions PR1 and NR1, as will be described with reference to FIGS. 6 and 7A. For example, the substrate may be a silicon wafer, a germanium wafer, or a silicon-on-insulator (SOI) wafer. The first and second MOSFET regions PR1 and NR1 may be spaced apart from each other in the first direction Y by the first device isolation layer. Although FIG. 4 illustrates that each of the first and second MOSFET regions PR1 and NR1 is a single region, example embodiments are not limited thereto, and each of the first and second MOSFET regions PR1 and NR1 may include a plurality of regions divided by the first device isolation layer.

In some example embodiments, two MOSFET regions (e.g., the first and second MOSFET regions PR1 and NR1) included in one region (e.g., first region 120a) may be impurity regions of different types. For example, the first MOSFET region PR1 may be a p-type MOSFET (PMOSFET) region, and the second MOSFET region NR1 may be an n-type MOSFET (NMOSFET) region. In this example, the second power rail PW2 adjacent to the first MOSFET region PR1, which is a PMOSFET region, may serve as a pathway for providing a power supply voltage, and the first power rail PW1 adjacent to the second MOSFET region NR1, which is an NMOSFET region, may serve as a pathway for providing a ground voltage.

Each of the first, second, third and fourth gate electrodes G1, G2, G3 and G4 may extend in the first direction Y on the substrate, and may be provided on either the first MOSFET region PR1 or the second MOSFET region NR1. For example, the first and second gate electrodes G1 and G2 may be formed along the first direction Y on the first MOSFET region PR1, and the third and fourth gate electrodes G3 and G4 may be formed along the first direction Y on the second MOSFET region NR1.

The third gate electrode G3 may be aligned with the first gate electrode G1, and the fourth gate electrode G4 may be aligned with the second gate electrode G2. For example, the first gate electrode G1 may be provided in such a way that a line extending from the first gate electrode G1 in the longitudinal extension direction thereof (e.g., an extending line of the first gate electrode G1) is in the longitudinal extension direction of the third gate electrode G3, e.g., parallel to the first direction Y, and the second gate electrode G2 may be provided in such a way that a line extending from the second gate electrode G2 in the longitudinal extension direction thereof (e.g., an extending line of the second gate electrode G2) is in the longitudinal extension direction of the fourth gate electrode G4, e.g., parallel to the first direction Y. In some embodiments, opposing sidewalls of the first gate electrode G1 and the third gate electrode G3 may be aligned along the longitudinal extension direction (e.g., the first direction Y), and opposing sidewalls of the second gate electrode G2 and the fourth gate electrode G4 may be aligned along the longitudinal extension direction (e.g., the first direction Y). In some example embodiments, the first and third gate electrodes G1 and G3 may be formed by patterning a single conductive line extending in the first direction Y, and the second and fourth gate electrodes G2 and G4 may be formed by patterning another single conductive line extending in the first direction Y. For example, the conductive line may include a conductive material such as a polysilicon.

The first connection structure in the example of FIG. 4 may electrically connect the first gate electrode G1 with the fourth gate electrode G4, and may electrically connect the second gate electrode G2 with the third gate electrode G3. The first connection structure may include a first line ML1, a second line ML2, a third line ML3, a fourth line ML4, f a first connection line CML1 and a second connection line CML2.

The first line ML1 may be formed along the second direction X to be connected to the first gate electrode G1, the second line ML2 may be formed along the second direction X to be connected to the second gate electrode G2, the third line ML3 may be formed along the second direction X to be connected to the third gate electrode G3, and the fourth line ML4 may be formed along the second direction X to be connected to the fourth gate electrode G4. The first connection line CML1 may be formed along the first direction Y to connect the first line ML1 with the fourth line ML4, and the second connection line CML2 may be formed along the first direction Y to connect the second line ML2 with the third line ML3. For example, the lines ML1, ML2, ML3 and ML4 and the connection lines CML1 and CML2 may be formed of a metal such as tungsten, titanium, tantalum, or the like. In addition, vias V0 for connecting the gate electrodes G1, G2, G3 and G4 with the lines ML1, ML2, ML3 and ML4 and for connecting the lines ML1, ML2, ML3 and ML4 with the connection lines CML1 and CML2 may be formed.

In some example embodiments, a region between the first gate electrode G1 and the third gate electrode G3 and a region between the second gate electrode G2 and the fourth gate electrode G4 may be empty without forming the other gate electrodes or lines. As described above, after forming the two conductive lines and patterning or cutting a middle portion (e.g., a portion corresponding to a center of the first region 120a) to form the four gate electrodes G1, G2, G3 and G4, the gate cutting region may be maintained to or remained as the cut state without additional manufacturing processes.

In some example embodiments, at least a portion of the first, second, third and fourth lines ML1, ML2, ML3 and ML4 and the first and second connection lines CML1 and CML2 included in the first connection structure may be included in the second region 130a or the third region 150a. In the example of FIG. 4, a portion of the second line ML2 may be included in the second region 130a. However, example embodiments are not limited thereto.

Although not described in detail, the first region 120a may further include at least one gate electrode formed to cross the first and second MOSFET regions PR1 and NR1.

The second region 130a may be formed between the second power rail PW2 and a third power rail PW3. The second region 130a may include a third MOSFET region PR2, a fourth MOSFET region NR2, the first gate electrode G1, the second gate electrode G2, a fifth gate electrode G5, a sixth gate electrode G6 and a second connection structure. A configuration of the second region 130a may be similar to that of the first region 120a, and thus descriptions of similar elements will be omitted.

The third MOSFET region PR2 and the fourth MOSFET region NR2 may be spaced apart from each other. For example, the third and fourth MOSFET regions PR2 and NR2 may be formed in the substrate, and a second device isolation layer may be provided on the substrate to define the third and fourth MOSFET regions PR2 and NR2.

In some example embodiments, when the first MOSFET region PR1 is a PMOSFET region and the power supply voltage is provided through the second power rail PW2, the third MOSFET region PR2 adjacent to the first MOSFET region PR1 and the second power rail PW2 may be a PMOSFET region, and the fourth MOSFET region NR2 spaced apart from the third MOSFET region PR2 may be an NMOSFET region. In other words, two MOSFET regions (e.g., the first and third MOSFET regions PR1 and PR2) adjacent to one power rail (e.g., the second power rail PW2) and included in different regions (e.g., the first and second regions 120a and 130a) may be impurity regions of the same type. The third power rail PW3 adjacent to the fourth MOSFET region NR2, which is an NMOSFET region, may serve as a pathway for providing the ground voltage.

The first and second gate electrodes G1 and G2 may extend to cross the second power rail PW2 between the first region 120a and the second region 130a, and may extend to an upper portion of the third MOSFET region PR2 in the second region 130a. In other words, the first and second gate electrodes G1 and G2 may be formed along the first direction Y on the third MOSFET region PR2. Although the first gate electrode G1 (or the second gate electrode G2) on the first and third MOSFET regions PR1 and PR2 is illustrated as being cut by the second power rail PW2, the first gate electrode G1 (or the second gate electrode G2) may actually be one integrated gate electrode because the second power rail PW2 is formed above the gate electrodes. That is, the first gate electrode G1 (or the second gate electrode G2) may continuously extend from the first MOSFET region PR1 to the third MOSFET region PR2, and the second power rail PW2 may extend over or in a direction intersecting the first gate electrode G1 (or the second gate electrode G2) on a different level.

The fifth gate electrode G5 and the sixth gate electrode G6 may be formed along the first direction Y on the fourth MOSFET region NR2. The fifth gate electrode G5 may be aligned with the first gate electrode G1, and the sixth gate electrode G6 may be aligned with the second gate electrode G2.

The second connection structure in the example of FIG. 4 may electrically connect the first gate electrode G1 with the sixth gate electrode G6, and may electrically connect the second gate electrode G2 with the fifth gate electrode G5. The second connection structure may include the first line ML1, the second line ML2, a fifth line ML5, a sixth line ML6, the first connection line CML1 and the second connection line CML2.

The fifth line ML5 may be formed along the second direction X to be connected to the fifth gate electrode G5, and the sixth line ML6 may be formed along the second direction X to be connected to the sixth gate electrode G6. The first connection line CML1 may be formed along the first direction Y to connect the first line ML1 with the sixth line ML6, and the second connection line CML2 may be formed along the first direction Y to connect the second line ML2 with the fifth line ML5. Vias V0 for connecting the gate electrodes G5 and G6 with the lines ML5 and ML6 and for connecting the lines ML5 and ML6 with the connection lines CML1 and CML2 may be formed. The connection lines CML1 and CML2 may extend to cross the second and third power rails PW2 and PW3, and may extend to upper portions of the second and third regions 130a and 150a.

In some example embodiments, a region between the first gate electrode G1 and the fifth gate electrode G5 and a region between the second gate electrode G2 and the sixth gate electrode G6 may be empty (e.g., without forming or free of the other gate electrodes or lines).

In some example embodiments, at least a portion of the first, second, fifth and sixth lines ML1, ML2, ML5 and ML6 and the first and second connection lines CML1 and CML2 included in the second connection structure may be included in the first region 120a or the third region 150a. In the example of FIG. 4, a portion of the first line ML1 may be included in the first region 120a, and portions of the fifth and sixth lines ML5 and ML6 may be included in the third region 150a. However, example embodiments are not limited thereto.

In some example embodiments, the first connection structure and the second connection structure may share some components. For example, the first and second lines ML1 and ML2 and the first and second connection lines CML1 and CML2 may be shared by the first and second connection structures.

The third region 150a may be formed between the third power rail PW3 and a fourth power rail PW4. The third region 150a may include a fifth MOSFET region NR3, a sixth MOSFET region PR3, the fifth gate electrode G5 and the sixth gate electrode G6.

The fifth MOSFET region NR3 and the sixth MOSFET region PR3 may be spaced apart from each other. For example, the fifth and sixth MOSFET regions NR3 and PR3 may be formed in the substrate, and a third device isolation layer may be provided on the substrate to define the fifth and sixth MOSFET regions NR3 and PR3.

In some example embodiments, when the fourth MOSFET region NR2 is an NMOSFET region and the ground voltage is provided through the third power rail PW3, the fifth MOSFET region NR3 adjacent to the fourth MOSFET region NR2 and the third power rail PW3 may be an NMOSFET region, the sixth MOSFET region PR3 spaced apart from the fifth MOSFET region NR3 may be a PMOSFET region, and the fourth power rail PW4 adjacent to the sixth MOSFET region PR3, which is a PMOSFET region, may serve as a pathway for providing the power supply voltage.

The fifth gate electrode G5 and the sixth gate electrode G6 may extend to cross the third power rail PW3 between the second region 130a and the third region 150a, and may extend to upper portions of the fifth and sixth MOSFET regions NR3 and PR3 in the third region 150a. Unlike or in contrast to the first and second regions 120a and 130a, the third region 150a may not include the gate cutting region. That is, the fifth gate electrode G5 and the sixth gate electrode G6 may continuously extend from the fifth MOSFET region NR3 (or in some embodiments from the fourth MOSFET region NR2) to the sixth MOSFET region PR3.

In some example embodiments, by the first and second connection structures, the first, fourth and sixth gate electrodes G1, G4 and G6 may be electrically connected to each other to form the first clock line L1 supplying the first clock signal CK, and the second, third and fifth gate electrodes G2, G3 and G5 may be electrically connected to each other to form the second clock line L2 supplying the second clock signal/CK. For example, the first, fourth and sixth gate electrodes G1, G4 and G6 may be gate electrodes of transistors to which the first clock signal CK is applied, and the second, third and fifth gate electrodes G2, G3 and G5 may be gate electrodes of transistors to which the second clock signal/CK is applied. The first and second connection structures may thus define cross couple connections to the first and second clock lines L1 and L2.

The fourth region 110a may be formed between the first power rail PW1 and the second power rail PW2, and may include the first MOSFET region PR1, the second MOSFET region NR1 and at least one gate electrode. The fifth region 140a may be formed between the second power rail PW2 and the third power rail PW3, and may include the third MOSFET region PR2, the fourth MOSFET region NR2 and at least one gate electrode. The MOSFET regions PR1, NR1, PR2 and NR2 and the power rails PW1, PW2 and PW3 may extend in the second direction X and may be shared by regions adjacent to each other along the second direction X. The fourth and fifth regions 110a and 140a may be less relevant to the above-described cross couple connection, and thus detailed illustrations and descriptions of similar elements for the fourth and fifth regions 110a and 140a will be omitted.

The scan flip-flop 100a of FIG. 4 may adopt or employ the cross couple connection to the first and second clock lines L1 and L2 for supplying the first and second clock signals CK and/CK to the first, second and third regions 120a, 130a, and 150a that are vertically aligned to have the parallel structure. Accordingly, the gate electrodes may be formed using only two conductive lines, and the integration degree may be improved or enhanced. In addition, the first and second connection structures for forming the cross couple connection may share some components, and thus the congestion of lines (or wirings) and layout may be reduced.

Figure 5:
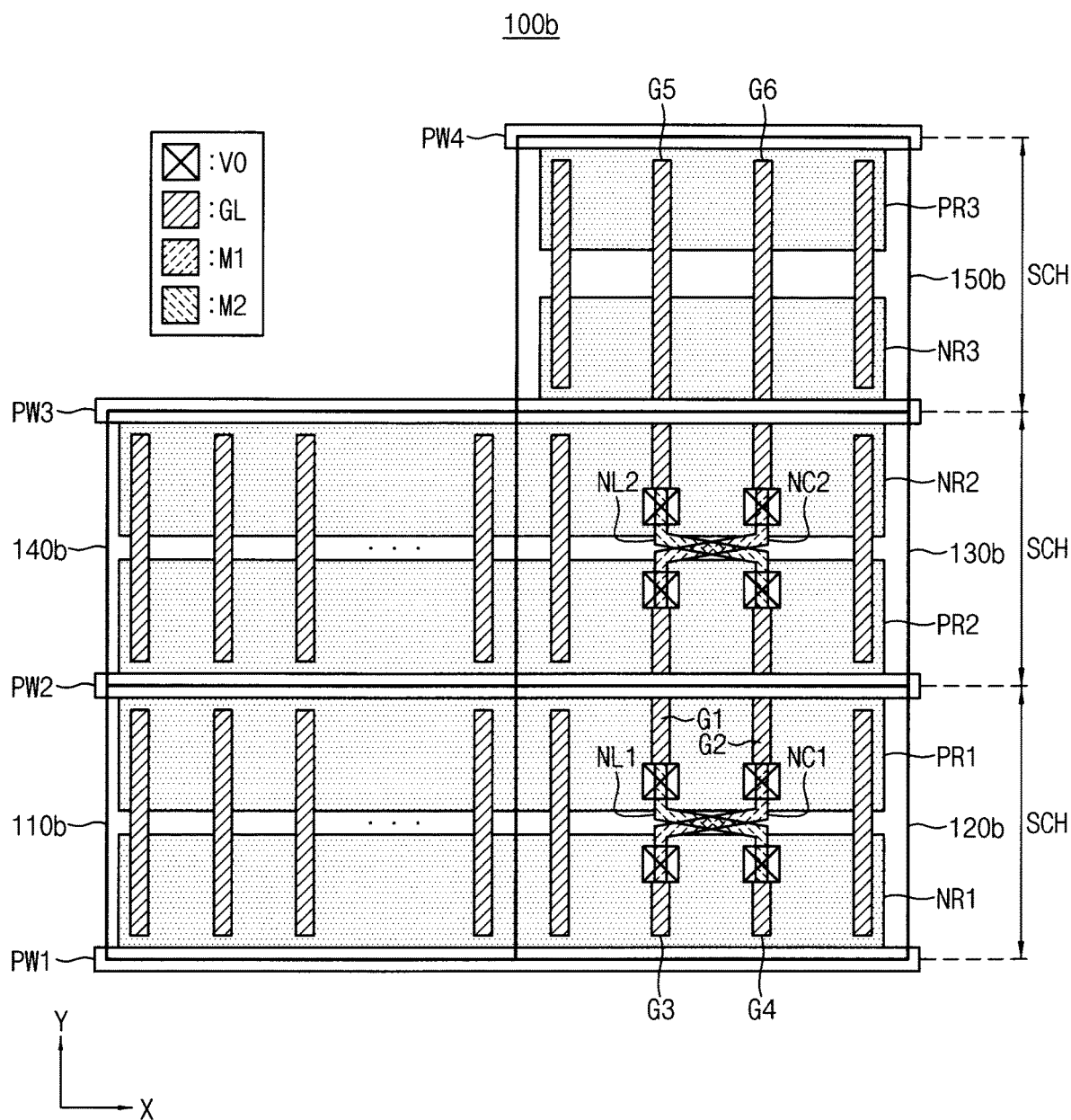
FIG. 5 is a plan view of another example of a layout of the scan flip-flop of FIG. 1.

FIG. 5 is a plan view of another example of a layout of the scan flip-flop of FIG. 1. Descriptions of elements similar to those described above with reference to FIG. 4 will be omitted.

Referring to FIG. 5, a scan flip-flop 100b may include a first region 120b in which the first latch 120 is formed, a second region 130b in which the second latch 130 is formed, a third region 150b in which the clock buffer 150 is formed, a fourth region 110b in which the multiplexer 110 is formed, and a fifth region 140b in which the output buffer 140 is formed.

The scan flip-flop 100b of FIG. 5 may be substantially the same as the scan flip-flop 100a of FIG. 4, except that first and second connection structures for forming the cross couple connection are changed.

The first connection structure in the example of FIG. 5 may include a first connection contact NC1 and a first connection line NL1. The first connection contact NC1 and the first connection line NL1 may be formed in or on regions between the first gate electrode G1 and the third gate electrode G3 and between the second gate electrode G2 and the fourth gate electrode G4. The first connection contact NC1 may connect the second gate electrode G2 with the third gate electrode G3. The first connection line NL1 may cross over the first connection contact NC1, and may connect the first gate electrode G1 with the fourth gate electrode G4. For example, the first connection contact NC1 may be configured and positioned to be able to apply the second clock signal/CK to both the second and third gate electrodes G2 and G3, and the first connection line NL1 may be configured and positioned to be able to apply the first clock signal CK to both the first and fourth gate electrodes G1 and G4.

Similarly, the second connection structure in the example of FIG. 5 may include a second connection contact NC2 and a second connection line NL2. The second connection contact NC2 and the second connection line NL2 may be formed in or on regions between the first gate electrode G1 and the fifth gate electrode G5 and between the second gate electrode G2 and the sixth gate electrode G6. The second connection contact NC2 may connect the first gate electrode G1 with the sixth gate electrode G6. The second connection line NL2 may cross over the second connection contact NC2, and may connect the second gate electrode G2 with the fifth gate electrode G5. For example, the second connection contact NC2 may be configured and positioned to be able to apply the first clock signal CK to both the first and sixth gate electrodes G1 and G6, and the second connection line NL2 may be configured and positioned to be able to apply the second clock signal/CK to both the second and fifth gate electrodes G2 and G5.

Figure 6:
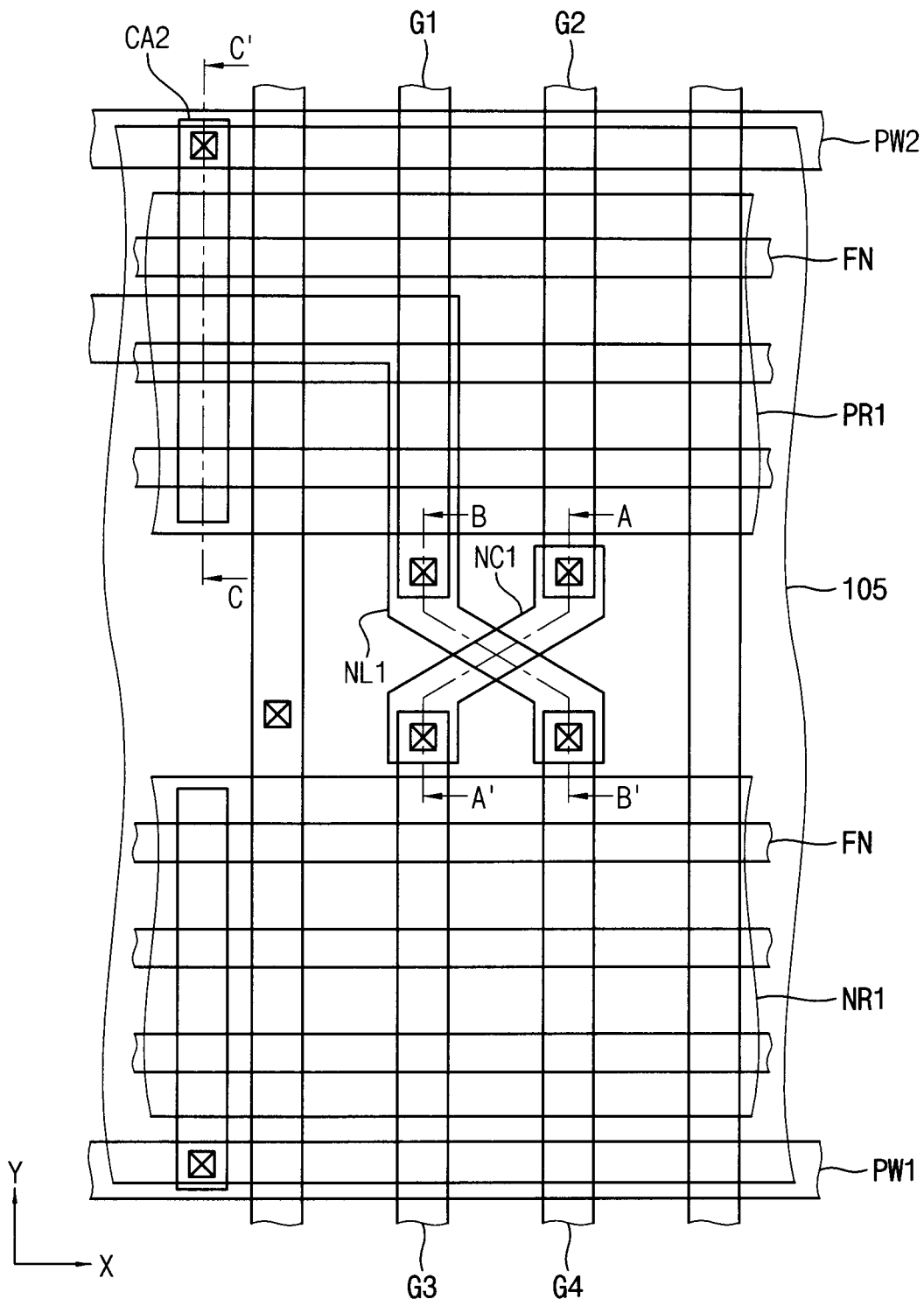
FIG. 6 is a plan view of an example of a first region included in the scan flip-flop of FIG. 5.
Figure 7A:
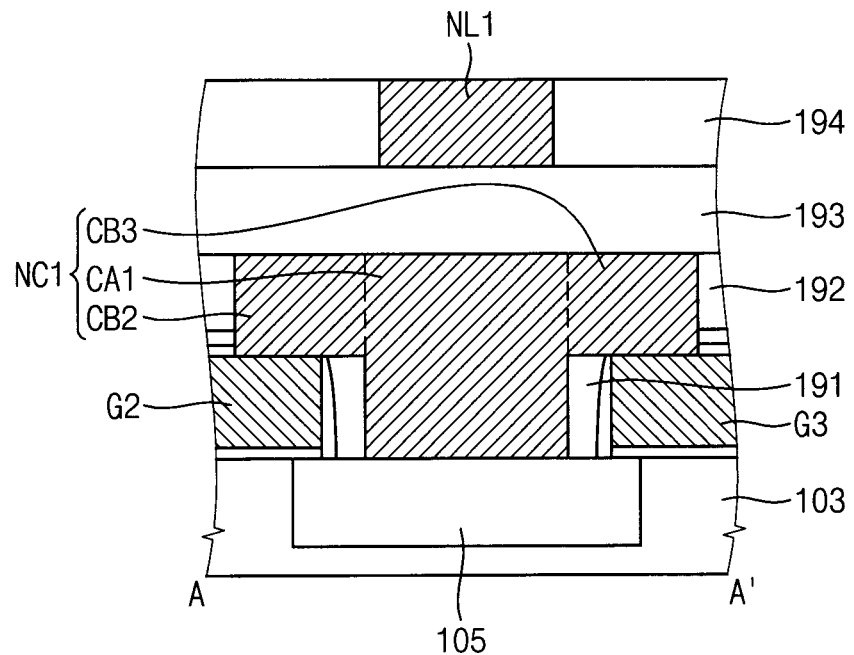
FIGS. 7A, 7B and 7C are cross-sectional views taken along lines A-A', B-B' and C-C', respectively, of FIG. 6.
Figure 7B:
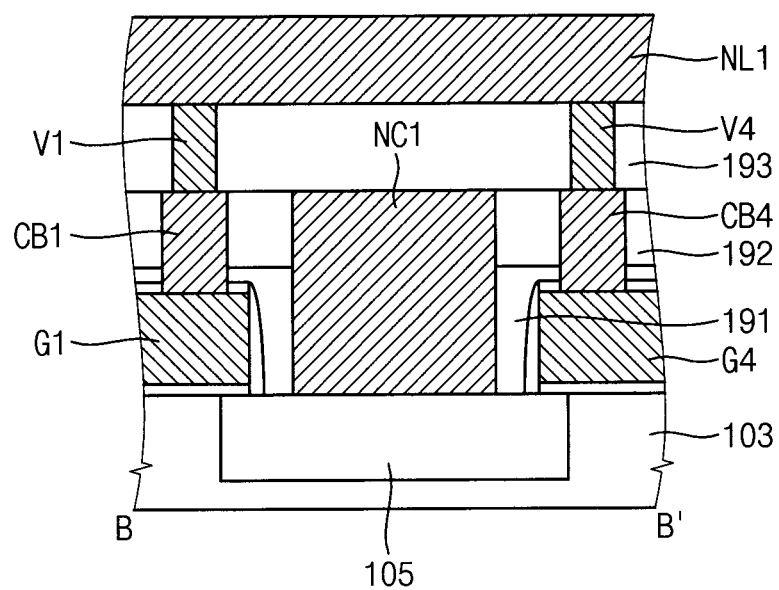
Figure 7C:
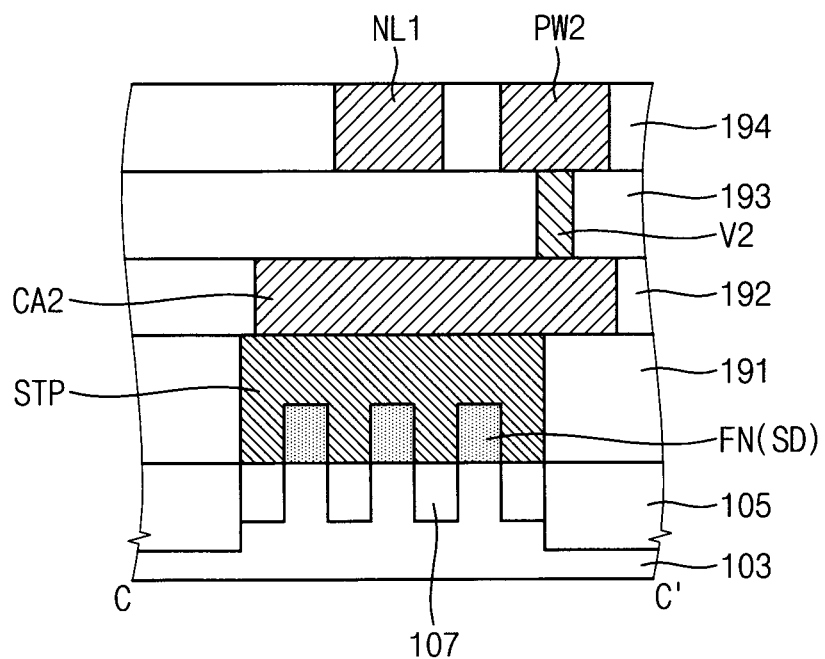

FIG. 6 is a plan view of an example of a first region 120*b* included in the scan flip-flop of FIG. 5. FIGS. 7A, 7B and 7C are cross-sectional views taken along lines A-A', B-B' and C-C', respectively, of FIG. 6.

Referring to FIGS. 6, 7A and 7B, a first device isolation layer 105 may be provided on a substrate 103 to define the first and second MOSFET regions PR1 and NR1. The first and second MOSFET regions PR1 and NR1 may be spaced apart from each other in the first direction Y by the first device isolation layer 105.

The gate electrodes G1, G2, G3 and G4 may be provided on the substrate 103 to extend along the first direction Y. The gate electrodes G1, G2, G3 and G4 may be provided in a first interlayered insulating layer 191. The gate electrodes G1, G2, G3 and G4 may be provided on the first MOSFET region PR1 or the second MOSFET region NR1.

The first connection structure including the first connection contact NC1 and the first connection line NL1 may be provided on the first region 120*b*. The first connection contact NC1 and the first connection line NL1 may be provided, for example, between the first and second MOSFET regions PR1 and NR1, e.g., on the first device isolation layer 105.

The first connection contact NC1 may include a first active contact CA1 provided on the first device isolation layer 105, and second and third gate contacts CB2 and CB3 extending laterally from the first active contact CA1 to cover at least partially upper or top surfaces of the second and third gate electrodes G2 and G3. The second gate contact CB2 may be in contact with and electrically connected to the upper surface of the second gate electrode G2. The third gate contact CB3 may be in contact with and electrically connected to the upper surface of the third gate electrode G3.

In some example embodiments, the first active contact CA1 and the second and third gate contacts CB2 and CB3 may be provided in the form of a single conductive element, in which an interface region is not formed. For example, a first contact hole, in which the first active contact CA1 is formed, may be separately formed using an etching process different from that for forming second contact holes, in which the second and third gate contacts CB2 and CB3 are formed, and the first connection contact NC1 may be formed by filling the first and second contact holes with a conductive material. The first connection contact NC1 may be formed of metals, conductive metal nitrides, and/or doped semiconductors. For example, the first connection contact NC1 may include tungsten, titanium, tantalum, and/or nitrides thereof.

The first connection line NL1 may be provided on the first connection contact NC1 to cross the first connection contact NC1 (e.g., the first connection line NL1 may cross over the first connection contact NC1). The first connection line NL1 and the first connection contact NC1 may be provided over the first device isolation layer 105 to intersect each other.

The first connection line NL1 may be electrically connected to the first gate electrode G1 via a first via hole V1 and a first gate contact CB1, and may be electrically connected to the fourth gate electrode G4 via a fourth via hole V4 and a fourth gate contact CB4. The first and fourth gate contacts CB1 and CB4 may be provided in a second interlayered insulating layer 192, and the first and fourth via holes V1 and V4 may be provided in a third interlayered insulating layer 193 on the second interlayered insulating layer 192.

The first connection line NL1 may be disposed in a fourth interlayered insulating layer 194. The first and fourth via holes V1 and V4 and the first and fourth gate contacts CB1 and CB4 may include conductive metal nitrides, and/or doped semiconductor materials. In some example embodiments, the first and fourth via holes V1 and V4 and the first and fourth gate contacts CB1 and CB4 may be formed using a chemical vapor deposition process and/or a sputtering process. At least one of the interlayered insulating layers may include silicon oxide.

Referring to FIGS. 6 and 7C, a plurality of active portions FN may be provided on each of the first and second MOSFET regions PR1 and NR1. For example, each of the plurality of active portions FN may be provided between a plurality of second device isolation layers 107 extending along the second direction X and have a fin-shaped structure. The plurality of active portions FN may cross the gate electrodes G1, G2, G3 and G4 and extend along the second direction X.

Although FIGS. 6 and 7C illustrate that three active portions FN are formed on each of the first and second MOSFET regions PR1 and NR1, example embodiments are not limited thereto. The first and second device isolation layers 105 and 107 may be a portion of a continuously-connected single insulating layer. In some example embodiments, the first device isolation layer 105 may be thicker than the second device isolation layers 107, and in this case, the second device isolation layers 107 may be separately formed using a process different from that for forming the first device isolation layer 105. In other example embodiments, the first and second device isolation layers 105 and 107 may be formed using the same process and may have substantially the same thickness. The first and second device isolation layers 105 and 107 may be formed on the substrate 103. The first and second device isolation layers 105 and 107 may include, for example, a silicon oxide layer.

Source/drain regions SD may be formed in portions of the active portions FN that are not covered with the gate electrodes G1, G2, G3 and G4. As illustrated in FIG. 7C, the source/drain regions SD may be positioned in the active portions FN, but in some example embodiments, may extend toward a top of the substrate 103 or into a region between the second device isolation layers 107. The source/drain regions SD may be of p-type in the first MOSFET region PR1, and may be of n-type in the second MOSFET region NR1.

In the first MOSFET region PR1, the source/drain regions SD may be electrically connected to each other by connection conductive patterns STP. For example, the connection conductive patterns STP may be formed to extend on or cover the active portions FN, thereby connecting the source/drain regions SD spaced apart from each other in the first direction Y. Each of the connection conductive patterns STP may be directly connected to the active portions FN. As used herein, when elements are referred to as "directly on" or "directly connected" to one another, no intervening elements are present. The connection conductive patterns STP may include a metal-silicide layer. For example, the connection conductive patterns STP may include titanium-silicide, tantalum-silicide, and/or tungsten-silicide. The connection conductive patterns STP may further include a metal layer, including titanium, tantalum, and/or tungsten. In some example embodiments, each of the connection conductive patterns STP may include a metal-silicide layer and a metal layer on the metal-silicide layer.

In the second MOSFET region NR1, the source/drain regions SD may be connected to each other, in the same manner as those of the first MOSFET region PR1, by the connection conductive patterns STP.

A second active contact CA2 may be provided on the connection conductive pattern STP. The second active contact CA2 may extend along the connection conductive pattern STP. A second via hole V2 may be provided on the second active contact CA2. The source/drain regions SD may be electrically connected to the second power rail PW2 through the connection conductive patterns STP, the second active contact CA2 and the second via hole V2.

Figure 8A:
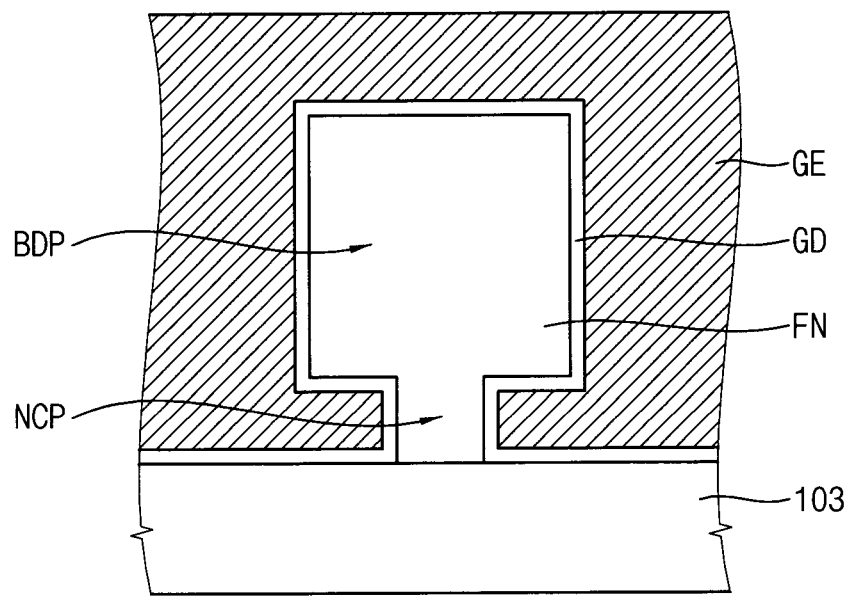
FIGS. 8A, 8B and 8C are cross-sectional views of examples of active portions included in the first region of FIG. 6.
Figure 8B:
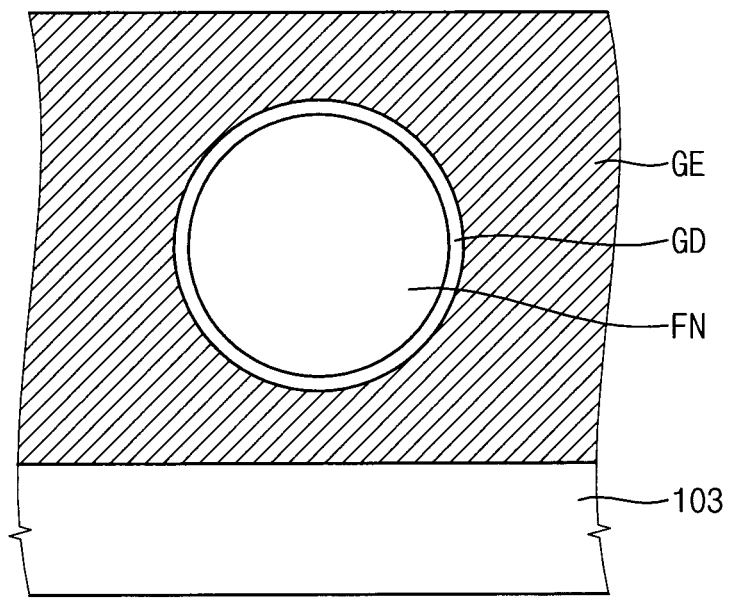
Figure 8C:
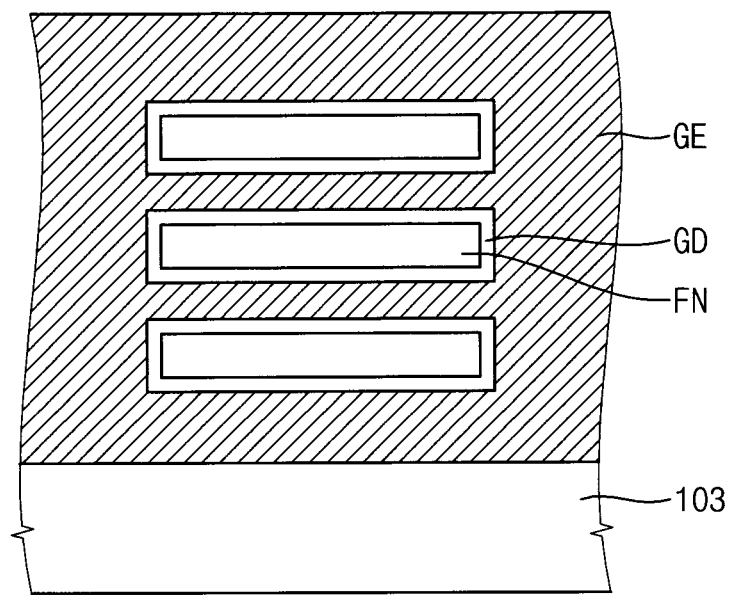

FIGS. 8A, 8B and 8C are cross-sectional views of examples of active portions included in the first region of FIG. 6. FIG. 7C illustrates that each of the active portions FN has a fin-shaped structure, however the structure thereof may be variously changed.

Referring to FIG. 8A, an active portion FN may be configured to have an omega-shaped structure including a neck portion NCP adjacent to the substrate 103 and a body portion BDP wider than the neck portion NCP, when viewed in a vertical section. A gate insulating layer GD and a gate electrode GE may be provided (e.g., sequentially) to extend on or cover the active portion FN. The gate electrode GE may include a portion extending below the body portion BDP of the active portion FN, that is, between the body portion BDP and the substrate 103.

Referring to FIG. 8B, an active portion FN may be provided in the form of a nanowire spaced apart from the substrate 103. A gate insulating layer GD and a gate electrode GE may be provided (e.g., sequentially) to extend on or cover the active portion FN. The gate electrode GE may include a portion interposed between the active portion FN and the substrate 103.

Referring to FIG. 8C, active portions FN may be formed in plurality along a vertical direction from the substrate 103. A gate insulating layer GD and a gate electrode GE may be provided (e.g., sequentially) to extend on or cover the active portions FN. The gate electrode GE may include a portion interposed between the active portions FN and a portion interposed between the active portion FN the substrate 103. The plurality of active portions FN may be sequentially stacked in the vertical direction from the substrate 103, and thus a semiconductor device including the active portions FN may be a multi-bridge-channel MOSFET (MBCFET).

FIG. 9 is a plan view of a scan flip-flop according to example embodiments. The descriptions of similar elements as discussed above with reference to FIG. 1 will be omitted.

Referring to FIG. 9, a scan flip-flop 100c includes a multiplexer 110, a first latch 120, a second latch 130, an output buffer 140 and a clock buffer 150.

The scan flip-flop 100c of FIG. 9 may be substantially the same as the scan flip-flop 100 of FIG. 1, except that an arrangement of the output buffer 140 is changed.

In the example of FIG. 9, one of the multiplexer 110 and the output buffer 140 (i.e., either the multiplexer 110 or the output buffer 140) may be disposed adjacent to the first side (e.g., the left side) of the first latch 120, the second latch 130 and the clock buffer 150, and the other one of the multiplexer 110 and the output buffer 140 may be disposed adjacent to the second side (e.g., the right side) of the first latch 120, the second latch 130 and the clock buffer 150. For example, in a plan view, the multiplexer 110 may be disposed adjacent to the first side of the first latch 120, and the output buffer 140 may be disposed adjacent to the second side of the second latch 130. However, example embodiments are not limited thereto, and positions of the multiplexer 110 and the output buffer 140 may be changed according to example embodiments.

Figure 10:
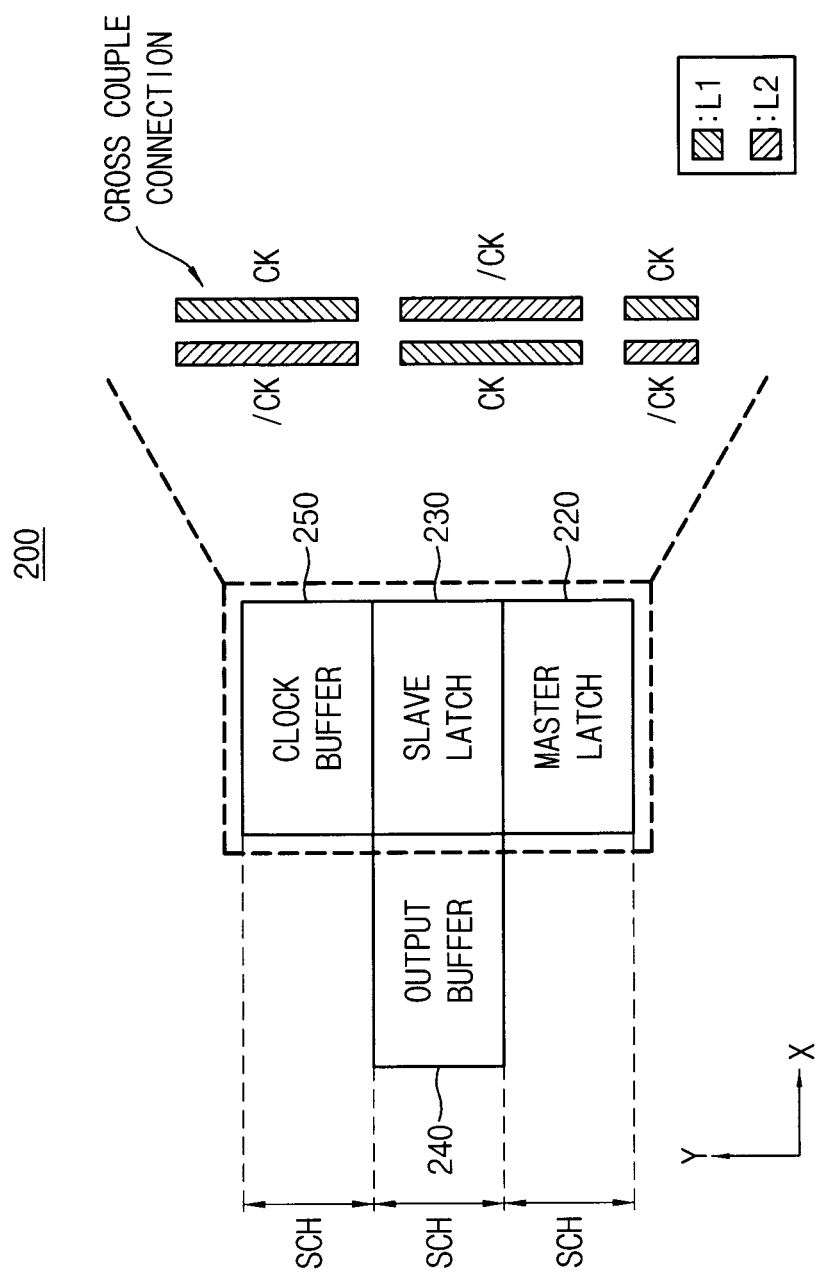
FIG. 10 is a plan view of a flip-flop according to example embodiments.

FIG. 10 is a plan view of a flip-flop according to example embodiments. The descriptions of similar elements as discussed above with reference to FIG. 1 will be omitted.

Referring to FIG. 10, a flip-flop 200 includes a first latch 220, a second latch 230, an output buffer 240 and a clock buffer 250.

The flip-flop 200 of FIG. 10 may be substantially the same as the scan flip-flop 100 of FIG. 1, except that the multiplexer 110 is omitted. In other words, an arrangement of the first latch 220, the second latch 230, the output buffer 240 and the clock buffer 250 in a plan view, and a cross couple connection of a first clock line L1 supplying a first clock signal CK and a second clock line L2 supplying a second clock signal/CK in the first latch 220, the second latch 230 and the clock buffer 250 may be substantially the same as described with reference to FIGS. 1 through 9.

The first latch 220 latches an input signal. The second latch 230 latches an output of the first latch 220. The output buffer 240 generates an output signal based on an output of the second latch 230. The clock buffer 250 generates the first clock signal CK and the second clock signal/CK provided to the first latch 220 and the second latch 230. Circuit configurations of the first latch 220, the second latch 230, the output buffer 240 and the clock buffer 250 may be substantially the same as described with reference to FIG. 2.

Figure 11:
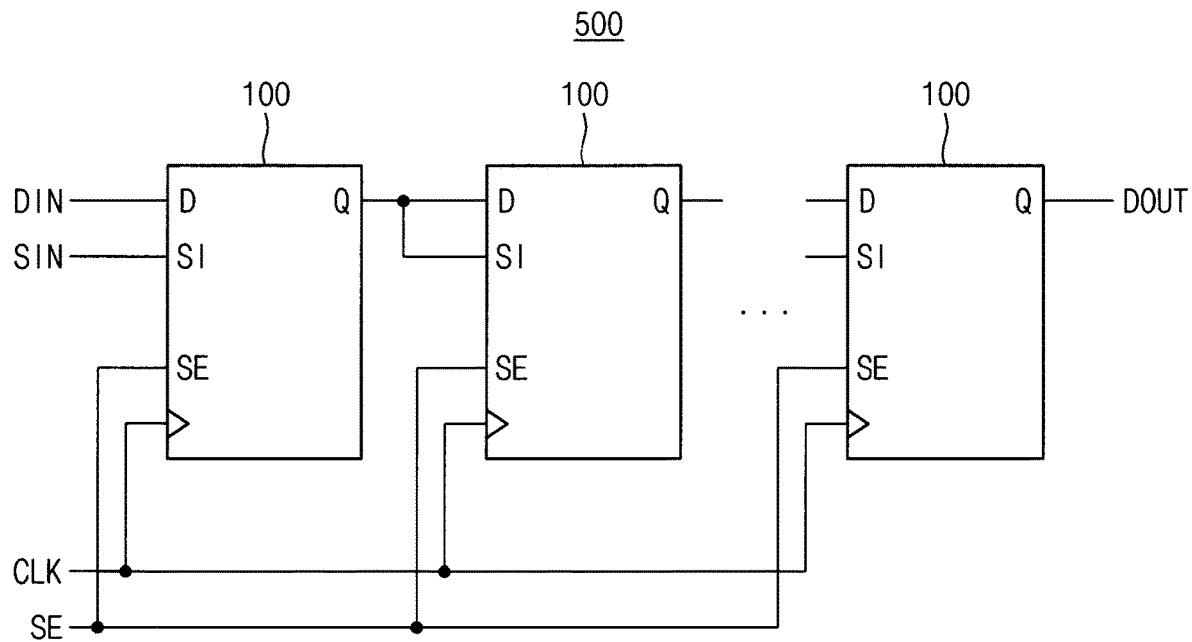
FIG. 11 is a block diagram illustrating a scan chain including a scan flip-flop according to example embodiments.

FIG. 11 is a block diagram illustrating a scan chain including a scan flip-flop according to example embodiments.

Referring to FIG. 11, a scan chain 500 may include a plurality of scan flip-flops 100. Each of the plurality of scan flip-flops 100 may be any of the scan flip-flops according to example embodiments described with reference to FIGS. 1 through 9. Each of the plurality of scan flip-flops 100 may be manufactured by using a standard cell included in a standard cell library. For example, the standard cell may be designed as in FIG. 4 or FIG. 5.

Each of the plurality of scan flip-flops 100 may include a first input terminal D receiving a data input signal, a second input terminal SI receiving a scan input signal, a third input terminal receiving a scan enable signal SE, a clock terminal receiving an input clock signal CLK, and an output terminal Q outputting an output signal. For example, the frontmost scan flip-flop 100 may receive input data DIN and scan data SIN through the first input terminal D and the second input terminal SI, respectively. The scan flip-flop 100 subsequent to the frontmost scan flip-flop 100 may receive the output signal of the frontmost scan flip-flop 100 through the first input terminal D and the second input terminal SI.

However, example embodiments are not limited thereto. In some example embodiments, the first and second input terminals D and SI of the scan flip-flop 100 may respectively receive the output signal and an inverted output signal. Also, in some example embodiments, the first and second input terminals D and SI of the scan flip-flop 100 may receive the inverted output signal. Although not illustrated, in some example embodiments, the output signal from the scan flip-flop 100 may be processed by a logic network and may be input to the first and/or second input terminals D and SI of the scan flip-flop 100 of the next stage. For example, the logic network may be a combinational logic circuit.

Figure 12:
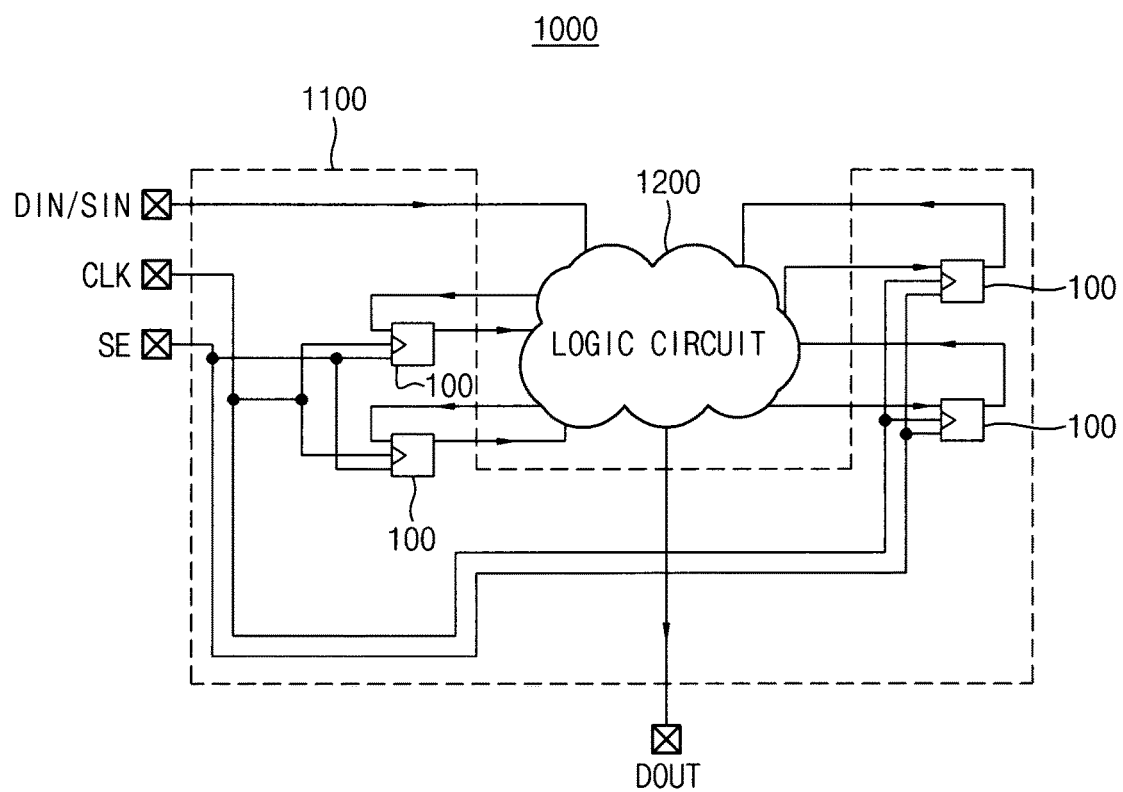
FIG. 12 is a block diagram illustrating a data processing device including a scan flip-flop according to example embodiments.

FIG. 12 is a block diagram illustrating a data processing device including a scan flip-flop according to example embodiments.

Referring to FIG. 12, a data processing device 1000 may include a scan flip-flop group 1100 and a logic circuit 1200. For example, the data processing device 1000 may be implemented with an integrated circuit (IC), a system-on-chip (SoC), a central processing unit (CPU) or a processor.

The scan flip-flop group 1100 may include a plurality of scan flip-flops 100. Each of the plurality of scan flip-flops 100 may be any of the scan flip-flops according to example embodiments described with reference to FIGS. 1 through 9. Each of the plurality of scan flip-flops 100 may perform data communication with the logic circuit 1200 based on an input clock signal CLK. The logic circuit 1200 may be implemented as a synchronous circuit or an asynchronous circuit. The logic circuit 1200 may process input data DIN or scan data SIN, and may provide output data DOUT corresponding to a result of the processing.

Figure 13:
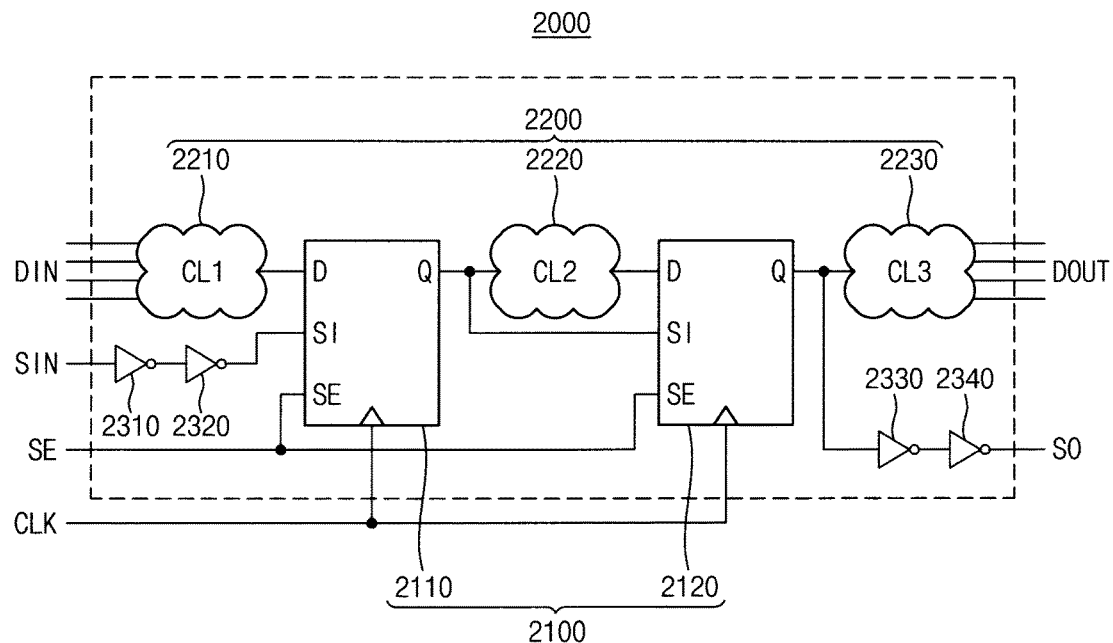
FIG. 13 is a block diagram illustrating a scan test circuit including a scan flip-flop according to example embodiments.

FIG. 13 is a block diagram illustrating a scan test circuit including a scan flip-flop according to example embodiments.

Referring to FIG. 13, a scan test circuit 2000 may include a sequential circuit unit 2100, a combinational circuit unit 2200 and a plurality of inverters 2310, 2320, 2330 and 2340. The sequential circuit unit 2100 may include a first scan flip-flop 2110 and a second scan flip-flop 2120, and the combinational circuit unit 2200 may include a first combinational logic circuit 2210, a second combinational logic circuit 2220 and a third combinational logic circuit 2230.

The first combinational logic circuit 2210 may perform a logical operation or an arithmetic operation on a plurality of input data DIN to provide a data input signal D to the first scan flip-flop 2110. The first scan flip-flop 2110 may be synchronized with an input clock signal CLK, may provide the data input signal D as output data Q in a normal operation mode (e.g., a mode where a scan enable signal SE has a logic low level), and may provide a scan input signal SI as the output data Q in a scan test mode (e.g., a mode where the scan enable signal SE has a logic high level).

The second combinational logic circuit 2220 may perform a logical operation on the output data Q of the first scan flip-flop 2110 to provide a data input signal D to the second scan flip-flop 2120. Also, the second scan flip-flop 2120 may receive the output data Q of the first scan flip-flop 2110 as a scan input signal SI. Further, the second scan flip-flop 2120 may operate in the normal operation mode or the scan test mode, based on the scan enable signal SE and the input clock signal CLK.

The third combinational logic circuit 2230 may perform a logical operation on the output data Q of the second scan flip-flop 2120 to provide a plurality of output data DOUT. Also, in the scan test mode, the third combinational logic circuit 2230 may provide, via the inverters 2330 and 2340, the output data Q of the second scan flip-flop 2120 as a scan output SO.

Figure 14:
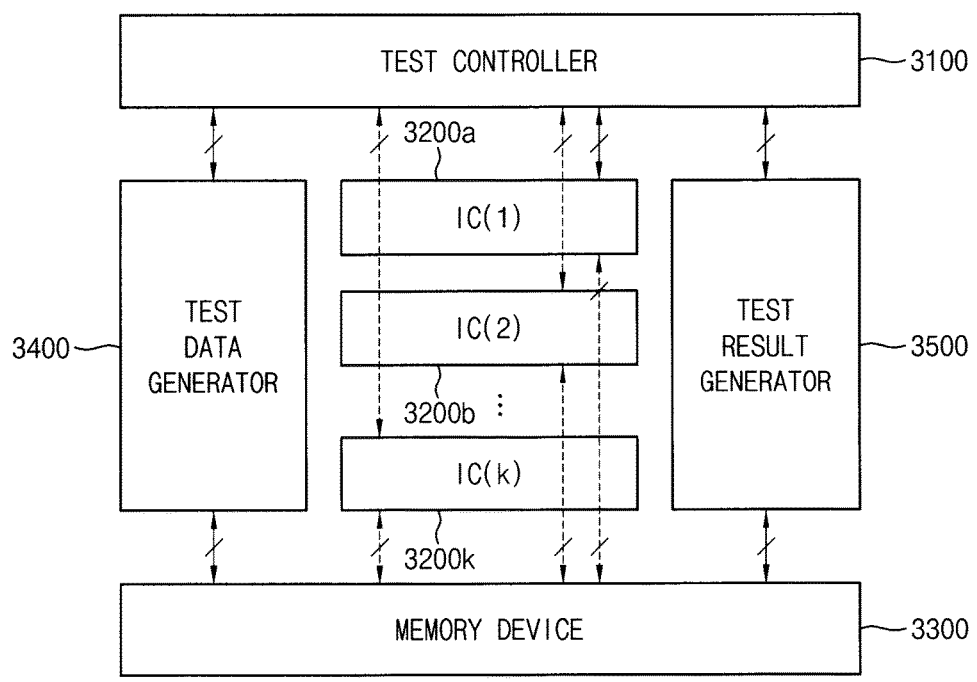
FIG. 14 is a block diagram illustrating an integrated circuit testing system according to example embodiments.

FIG. 14 is a block diagram illustrating an integrated circuit testing system according to example embodiments.

Referring to FIG. 14, an integrated circuit testing system 3000 may include a test controller 3100, a plurality of integrated circuits 3200a, 3200b, . . . , 3200k, a memory device 3300, a test data generator 3400 and a test result generator 3500.

Each of the integrated circuits 3200a to 3200k may include the scan flip-flop, the scan chain, the data processing device, and/or the scan test circuit according to example embodiments.

The test controller 3100 may control a scan test for each of the plurality of integrated circuits 3200a to 3200k by controlling components included in the integrated circuit testing system 3000. The memory device 3300 may store data for the scan test. The test data generator 3400 may generate the test pattern that is applied to the plurality of integrated circuits 3200a to 3200k. The test result generator 3500 may generate test results by comparing observed values output from the plurality of integrated circuits 3200a to 3200k with a reference pattern.

The inventive concepts may be applied to various electronic devices and/or systems including the scan flip-flop, the flip-flop and the scan test circuit. For example, the inventive concepts may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A scan flip-flop comprising:
a multiplexer configured to select a data input signal or a scan input signal based on an operation mode;
a first latch configured to latch an output of the multiplexer;
a second latch configured to latch an output of the first latch;
an output buffer configured to generate an output signal based on an output of the second latch; and
a clock buffer configured to generate a first clock signal and a second clock signal that control operation of the first latch and the second latch,
wherein the first latch, the second latch and the clock buffer are sequentially arranged along a first direction,
wherein each of the multiplexer and the output buffer is adjacent to the first latch, the second latch, or the clock buffer along a second direction intersecting the first direction, and
wherein a first clock line configured to supply the first clock signal and a second clock line configured to supply the second clock signal have a cross couple connection.

2. The scan flip-flop of claim 1, wherein a first region including the first latch comprises:
a first gate electrode and a second gate electrode extending along the first direction on a first metal oxide semiconductor field effect transistor (MOSFET) region in the first region;
a third gate electrode and a fourth gate electrode extending along the first direction on a second MOSFET region in the first region, wherein the second MOSFET region is spaced apart from the first MOSFET region in the first direction, wherein the third gate electrode is aligned with the first gate electrode along the first direction, and wherein the fourth gate electrode is aligned with the second gate electrode along the first direction; and
a first connection structure electrically connecting the first gate electrode with the fourth gate electrode, and electrically connecting the second gate electrode with the third gate electrode.

3. The scan flip-flop of claim 2, wherein the first connection structure comprises:
a first line extending along the second direction and electrically connected to the first gate electrode;
a second line extending along the second direction and electrically connected to the second gate electrode;
a third line extending along the second direction and electrically connected to the third gate electrode;
a fourth line extending along the second direction and electrically connected to the fourth gate electrode;
a first connection line extending along the first direction and electrically connecting the first line with the fourth line; and
a second connection line extending along the first direction and electrically connecting the second line with the third line.

4. The scan flip-flop of claim 3, wherein a region between the first gate electrode and the third gate electrode and a region between the second gate electrode and the fourth gate electrode are free of gate electrodes or lines.

5. The scan flip-flop of claim 3, wherein at least a portion of the first line, the second line, the third line, the fourth line, the first connection line, and/or the second connection line of the first connection structure is included in a second region comprising the second latch or a third region comprising the clock buffer.

6. The scan flip-flop of claim 2, wherein the first connection structure comprises:
a first connection contact electrically connecting the second gate electrode with the third gate electrode; and
a first connection line crossing over the first connection contact and electrically connecting the first gate electrode with the fourth gate electrode.

7. The scan flip-flop of claim 6, wherein:
the first region further comprises a first device isolation layer between the first MOSFET region and the second MOSFET region; and
the first connection line crosses over the first connection contact on the first device isolation layer.

8. The scan flip-flop of claim 6, wherein the first connection contact is in contact with an upper surface of the second gate electrode and an upper surface of the third gate electrode.

9. The scan flip-flop of claim 6, wherein the first connection structure further comprises:
respective vias between the first connection line and the first gate electrode, and between the first connection line and the fourth gate electrode.

10. The scan flip-flop of claim 2, wherein the first gate electrode and the second gate electrode cross a first power rail between the first region and a second region comprising the second latch, and extend to a third MOSFET region in the second region.

11. The scan flip-flop of claim 10, wherein the second region comprises:
a fifth gate electrode and a sixth gate electrode extending along the first direction on a fourth MOSFET region in the second region, wherein the fourth MOSFET region is spaced apart from the third MOSFET region in the first direction, wherein the fifth gate electrode is aligned with the first gate electrode along the first direction, and wherein the sixth gate electrode is aligned with the second gate electrode along the first direction; and
a second connection structure electrically connecting the first gate electrode with the sixth gate electrode, and electrically connecting the second gate electrode with the fifth gate electrode.

12. The scan flip-flop of claim 11, wherein the fifth gate electrode and the sixth gate electrode cross a second power rail between the second region and a third region comprising the clock buffer, and extend to a fifth MOSFET region and a sixth MOSFET region that are included in the third region and are spaced apart from each other in the first direction.

13. The scan flip-flop of claim 11, wherein:
the first gate electrode, the fourth gate electrode, and the sixth gate electrode are electrically connected to each other and define the first clock line that is configured to supply the first clock signal; and
the second gate electrode, the third gate electrode, and the fifth gate electrode are electrically connected to each other and define the second clock line that is configured to supply the second clock signal.

14. The scan flip-flop of claim 13, wherein the clock buffer is configured to invert the first clock signal to generate the second clock signal.

15. The scan flip-flop of claim 12, wherein:
one of the first power rail and the second power rail is configured to supply a power supply voltage; and another one of the first power rail and the second power rail is configured to supply a ground voltage.

16. The scan flip-flop of claim 1, wherein both the multiplexer and the output buffer are adjacent a first side of the first latch, the second latch, and the clock buffer.

17. The scan flip-flop of claim 1, wherein:
one of the multiplexer and the output buffer is adjacent a first side of the first latch, the second latch, and the clock buffer;
another one of the multiplexer and the output buffer is adjacent a second side of the first latch, the second latch, and the clock buffer; and
the second side of the first latch is opposite to the first side of the first latch.

18. The scan flip-flop of claim 1, wherein the first latch is a master latch, and the second latch is a slave latch.

19. A scan test circuit comprising:
a sequential circuit unit comprising a first scan flip-flop and a second scan flip-flop; and
a combinational circuit unit comprising:
a first combinational logic circuit configured to perform a logical operation on a plurality of data to generate a first data input signal, and to provide the first data input signal to the first scan flip-flop; and
a second combinational logic circuit configured to perform a logical operation on an output signal of the first scan flip-flop to generate a second data input signal, and to provide the second data input signal to the second scan flip-flop, wherein the first scan flip-flop comprises:
a first latch, a second latch, and a clock buffer sequentially arranged along a first direction; and
a multiplexer and a output buffer, each of which is adjacent the first latch, the second latch, or the clock buffer along a second direction intersecting the first direction,
wherein the clock buffer is configured to generate a first clock signal and a second clock signal that control operation of the first latch and the second latch, and
wherein a first clock line configured to supply the first clock signal and a second clock line configured to supply the second clock signal have a cross couple connection.

20. A flip-flop comprising:
a first latch configured to latch an input signal;
a second latch configured to latch an output of the first latch;
an output buffer configured to generate an output signal based on an output of the second latch; and
a clock buffer configured to generate a first clock signal and a second clock signal that control operation of the first latch and the second latch,
wherein the first latch, the second latch, and the clock buffer are sequentially arranged along a first direction,
wherein the output buffer is adjacent to the first latch, the second latch, or the clock buffer along a second direction intersecting the first direction,
wherein a first clock line configured to supply the first clock signal and a second clock line configured to supply the second clock signal have a cross couple connection,
wherein a first region including the first latch comprises:
a first metal oxide semiconductor field effect transistor (MOSFET) region and a second MOSFET region spaced apart from each other in the first direction;
a first gate electrode and a second gate electrode extending along the first direction on the first MOSFET region;
a third gate electrode and a fourth gate electrode extending along the first direction on the second MOSFET region, wherein the third gate electrode is aligned with the first gate electrode along the first direction, and wherein the fourth gate electrode is aligned with the second gate electrode along the first direction; and
a first connection structure electrically connecting the first gate electrode with the fourth gate electrode, and electrically connecting the second gate electrode with the third gate electrode,
wherein the first gate electrode and the second gate electrode cross a first power rail between the first region and a second region comprising the second latch, and extend to a third MOSFET region in the second region,
wherein the second region comprises:
the third MOSFET region and a fourth MOSFET region spaced apart from each other in the first direction;
a fifth gate electrode and a sixth gate electrode extending along the first direction on the fourth MOSFET region, wherein the fifth gate electrode is aligned with the first gate electrode along the first direction, and wherein the sixth gate electrode is aligned with the second gate electrode along the first direction; and
a second connection structure electrically connecting the first gate electrode with the sixth gate electrode, and electrically connecting the second gate electrode with the fifth gate electrode, and
wherein the fifth gate electrode and the sixth gate electrode cross a second power rail between the second region and a third region comprising the clock buffer, and extend to a fifth MOSFET region and a sixth MOSFET region that are included in the third region and are spaced apart from each other in the first direction.

\* \* \* \* \*